(12) United States Patent
Ge

(10) Patent No.: US 12,426,482 B2
(45) Date of Patent: Sep. 23, 2025

(54) DISPLAY PANEL AND DISPLAY APPARATUS

(71) Applicant: WUHAN TIANMA MICRO-ELECTRONICS CO., LTD., Wuhan (CN)

(72) Inventor: Shucheng Ge, Wuhan (CN)

(73) Assignee: WuHan TianMa Micro-electronics Co., Ltd., Wuhan (CN)

( * ) Notice: Subject to any disclaimer, the term of this patent is extended or adjusted under 35 U.S.C. 154(b) by 421 days.

(21) Appl. No.: 18/191,361

(22) Filed: Mar. 28, 2023

(65) Prior Publication Data

US 2023/0240121 A1    Jul. 27, 2023

(30) Foreign Application Priority Data

Nov. 3, 2022   (CN) .......................... 202211370871.3

(51) Int. Cl.
*H10K 59/80* (2023.01)
*H10K 50/80* (2023.01)
*H10K 50/858* (2023.01)
*H10K 59/00* (2023.01)
*H10K 59/12* (2023.01)

(52) U.S. Cl.
CPC .......... *H10K 59/879* (2023.02); *H10K 59/12* (2023.02)

(58) Field of Classification Search
CPC ...... H10K 59/879; H10K 59/12; H10K 59/00; H10K 50/858
See application file for complete search history.

(56) References Cited

U.S. PATENT DOCUMENTS 12,219,803 B2 *  2/2025  Cai ..................... H10K 59/879
2023/0397457 A1 * 12/2023  Cai ...................... H10K 50/85
2025/0098492 A1 *  3/2025  Song .................... H10K 50/844

FOREIGN PATENT DOCUMENTS

CN            113629214 A      11/2021

* cited by examiner

*Primary Examiner* — Joseph L Williams
(74) *Attorney, Agent, or Firm* — CHRISTENSEN O'CONNOR JOHNSON KINDNESS PLLC

(57) ABSTRACT

A display panel and a display apparatus where a peripheral structure surrounds a light extraction structure and has a smaller refractive index than the light extraction structure. The light extraction structure includes a first portion and a second portion located at a side of the first portion away from a substrate. An area of an orthographic projection of the second portion on the substrate is greater than an area of an orthographic projection of the first portion on the substrate. The first portion includes a first sidewall, and the second portion includes a second sidewall. The first sidewall extends away from a first axis. The first axis is perpendicular to the substrate and passes through a center of the orthographic projection of the light extraction structure on the substrate.

20 Claims, 18 Drawing Sheets

DISPLAY PANEL AND DISPLAY APPARATUS

CROSS-REFERENCE TO RELATED DISCLOSURE

The present disclosure claims priority to Chinese Patent Disclosure No. 202211370871.3, filed on Nov. 3, 2022, the content of which is incorporated herein by reference in its entirety.

TECHNICAL FIELD

The present disclosure relates to the field of display technologies, and particularly relates to a display panel and a display apparatus.

BACKGROUND

Organic Electroluminescence Display (OLED) display panels have been widely used due to their excellent characteristics such as high brightness, high efficiency, wide viewing angle and self-luminescence.

At present, OLED display panels mostly adopt a top light-emitting mode. In order to extract more light emitted by a light-emitting elements and improve the light-outgoing efficiency of the OLED display panel, the panel is usually disposed with a light extraction layer. A lens structure as a light extraction structure is disposed in the light extraction layer, and the light extraction structure improves the light output ratio by light refraction.

In order to realize the light extraction structure, a combination of a high-refractive-index layer and a low-refractive-index layer is adopted. The high-refractive-index layer is disposed at the side of the low-refractive-index layer toward a light-exiting surface of the display panel. The high-refractive-index layer is a whole-plane continuous structure. The high-refractive-index layer has a certain reflectivity to external ambient light incident on the high-refractive-index layer. Due to the large area of the high-refractive-index layer, the reflection of the external ambient light by the display panel increases.

SUMMARY

A first aspect of the present disclosure provides a display panel. The display panel includes a substrate; and a light extraction layer disposed at a side of the substrate. The light extraction layer comprises light extraction structures and a peripheral structure surrounding the light extraction structure, the peripheral structure has a smaller refractive index than the light extraction structure. The light extraction structure comprises a first portion and a second portion, the second portion is located at a side of the first portion away from the substrate, and an area of the orthographic projection of the second portion on the substrate is greater than an area of the orthographic projection of the first portion on the substrate; the first portion comprises a first sidewall inclined, and the second portion comprises a second sidewall inclined. In a direction from one end of the first sidewall adjacent to the substrate to one end of the first sidewall away from the substrate, the first sidewall extends in a direction away from a first axis; in a direction from one end of the second sidewall adjacent to the substrate to one end of the second sidewall away from the substrate, the second sidewall extends in a direction adjacent to a first axis; the first axis is perpendicular to the substrate, and passes through a center of the orthographic projection of the light extraction structure on the substrate.

A second aspect of the present disclosure provides a display apparatus including the display panel described in the first aspect.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings.

DESCRIPTION OF EMBODIMENTS

In order to better understand technical solutions of the present disclosure, the embodiments of the present disclosure are described in detail with reference to the drawings.

It should be clear that the described embodiments are merely part of the embodiments of the present disclosure rather than all of the embodiments. All other embodiments obtained by those skilled in the art shall fall into the protection scope of the present disclosure.

The terms used in the embodiments of the present disclosure are merely for the purpose of describing specific embodiment, rather than limiting the present disclosure. The terms "a", "an", "the" and "said" in a singular form in an embodiment of the present disclosure and the attached claims are also intended to include plural forms thereof, unless noted otherwise.

It should be understood that the term "or" used in the context of the present disclosure is to describe a correlation relation of related objects, indicating that there can be three relations, e. g., A or B can indicate only A, both A and B, and only B. In addition, the symbol "I" in the context generally indicates that the relation between the objects before and after the "I" is an "or" relation.

In this specification, it should be understood that the terms "basically", "approximately", "roughly", "about", "generally" and "substantially" described in the claims and embodiments of this disclosure refer to a reasonable process operation range or tolerance range, which can be substantially agreed, rather than an exact value.

It should be understood that although the terms 'first', 'second' and 'third' can be used in the present disclosure to describe sidewalls, these sidewalls should not be limited to these terms. These terms are used only to distinguish sidewalls from each other. For example, without departing from the scope of the embodiments of the present disclosure, a first sidewall can also be referred to as a second sidewall. Similarly, the second sidewall can also be referred to as the first sidewall.

Figure 1:
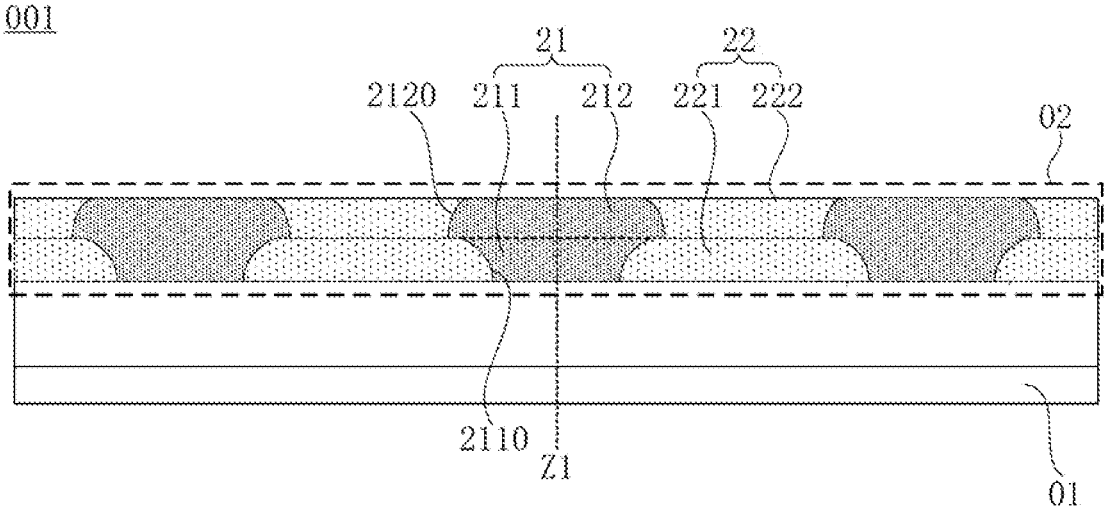
FIG. 1 is a schematic diagram of a display panel according to an embodiment of the present disclosure.

FIG. 1 is a schematic diagram of a display panel according to an embodiment of the present disclosure.

As shown in FIG. 1, the display panel 001 includes a substrate 01 and a light extraction layer 02 disposed at a side of the substrate 01. The light extraction layer 02 is disposed at a side of the substrate 01 toward a light-exiting surface of the display panel 001.

The light extraction layer 02 includes multiple light extraction structures 21 and a peripheral structure 22 surrounding each of the light extraction structures 21. A refractive index of the peripheral structure 22 is smaller than that of the light extraction structure 21, so that an interface between the light extraction structure 21 and the peripheral structure 22 surrounding the light extraction structure 21 is an interface between an optically dense medium and an optically thin medium.

In an embodiment, as shown in FIG. 1, the light extraction structure 21 includes a first portion 211 and a second portion 212. The second portion 212 is located at a side of the first portion 211 away from the substrate 01, and an area of the orthographic projection of the second portion 212 on the substrate 01 is greater than an area of the orthographic projection of the first portion 211 on the substrate 01. The first portion 211 and the second portion 212 are different portions of the light extraction structure 21. The second portion 212 is located at a side of the first portion 211 away from the substrate 01 and covers the first portion of 211.

The first portion 211 includes an inclined first sidewall 2110. A surface of the first portion 211 is in contact with the peripheral structure 22 and is inclined, and this surface is the first sidewall 2110 of the first portion 211. In a direction from one end of the first sidewall 2110 adjacent to the substrate 01 to one end of the first sidewall 2110 away from the substrate 01, the first sidewall 2110 extends away from a first axis Z1. A portion of the first portion 211 surrounded by the first sidewall 2110 has a gradually increasing width in a bottom-up direction. Reference of the bottom-up direction can be made to the position relation between the light extraction layer 02 and the substrate 01. The light extraction layer 02 is located above the substrate 01, and the substrate 01 is located below the light extraction layer 02.

The second portion 212 includes an inclined second sidewall 2120. A surface of the second portion 212 is in contact with peripheral structure 22 and is inclined, and this surface is the second sidewall 2120 of the second portion 212. In a direction from one end of the second sidewall 2120 adjacent to the substrate 01 to one end of the second sidewall 2120 away from the substrate 01, the second sidewall 2120 extends approaching the first axis Z1. A portion of the second portion 212 surrounded by the second sidewall 2120 is has a gradually increasing width in a bottom-up direction. It should be noted that the first axis Z1 is used as a reference for describing the extending directions of the first sidewall 2110 and the second sidewall 2120 and is not necessary the symmetry axis of the first portion 211 or the second portion 212. In some embodiments, the first axis Z1 is perpendicular to the substrate 01 and passes through a center of the bottom surface of the first portion 211 of the light extraction structure 21.

In the light extraction structure 21 of the display panel 001 provided in the embodiments of the present disclosure, a sidewall of the first portion 211 adjacent to the substrate 01 is inclined away from the first axis Z1, and a sidewall of the second portion 212 away from the substrate 01 is inclined toward a direction adjacent to the first axis Z1.

Figure 2:
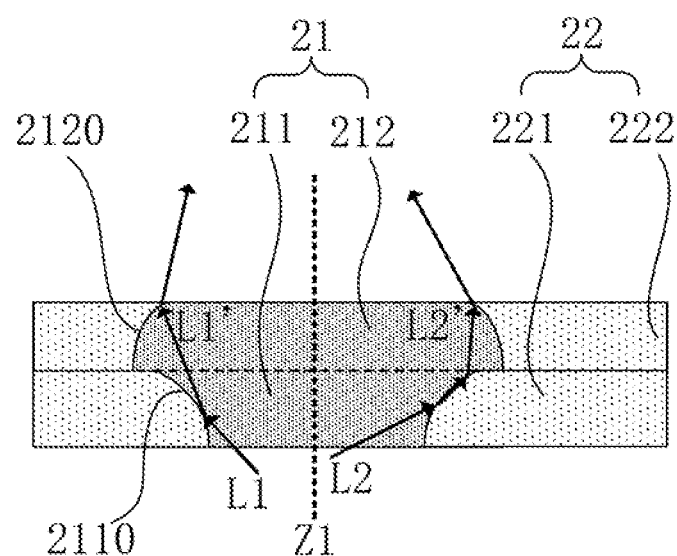
FIG. 2 is a diagram showing a principle of a light extraction structure in a display panel according to an embodiment of the present disclosure.

FIG. 2 is a diagram showing a principle of a light extraction structure in a display panel according to an embodiment of the present disclosure.

Referring to FIG. 1 and FIG. 2, since the first sidewall 2110 of the first portion 211 of the light extraction structure 21 is inclined toward a direction away from the first axis Z1, when large-angle lights are incident on the first sidewall 2110 of the light extraction structure 21, the amount of the large-angle lights L1 with an incident angle greater than or equal to a critical angle is large, and these large-angle lights L1 are reflected at the first sidewall 2110 and then become lights L1' with reduced angle. The large-angle lights L2 with an incident angle smaller than the critical angle is refracted when they are incident on the peripheral structure 22, and these large-angle lights L2 become lights L2' with reduced angle.

The lights L1' formed by reflection at the first sidewall 2110 and the lights L2' formed by refraction still include large-angle lights. These large-angle lights L1' and L2' are refracted by the second sidewall 2120 of the second portion 212 in the light extraction structure 21 and become lights with further reduced angel. The light extraction structure 21 in the display panel 001 provided by the embodiments of the present disclosure can convert more large-angle lights into small-angle lights, thereby having a better light extraction effect, and further improving the brightness of the display panel 001.

It should be noted that the first sidewall 2110 of the first portion 211 is inclined away from the first axis Z1, and a distance between one end of the first sidewall 2110 away from the substrate 01 and the first axis Z1 is greater than a distance between one end of the first sidewall 2110 adjacent to the substrate 01 and the first axis Z1. That means the end of the first sidewall 2110 adjacent to the substrate 01 is closer to the first axis Z1 than the end of the first sidewall 2110 away from the substrate 01. The second sidewall 2120 of the second portion 212 is inclined in a manner of approaching the first axis Z1, and a distance between one end of the second sidewall 2120 away from the substrate 01 and the first axis Z1 is smaller than a distance between one end of the second sidewall 2120 adjacent to the substrate 01 and the first axis Z1. That means the end of the second sidewall 2120 away from the substrate 01 and the first axis Z1 is closer to the end of the second sidewall 2120 adjacent to the substrate 01 and the first axi Z1.

In addition, the peripheral structure 22 surrounds the light extraction structure 21, is not connected with adjacent light extraction structures 21, that is, the light extraction structure 21 is an isolated island structure. The high refractive index of the light extraction structure 21 may cause reflection of light incident on the light extraction structure 21. Since the light extraction structure 21 is in the isolated structure, no structure with a high refractive index exists between adjacent light extraction structures 21, the reflection of the lights from outside of the display panel 001 by the layer with a high refractive index can be reduced, thereby increasing the resolution and display effect of the display panel.

Figure 3:
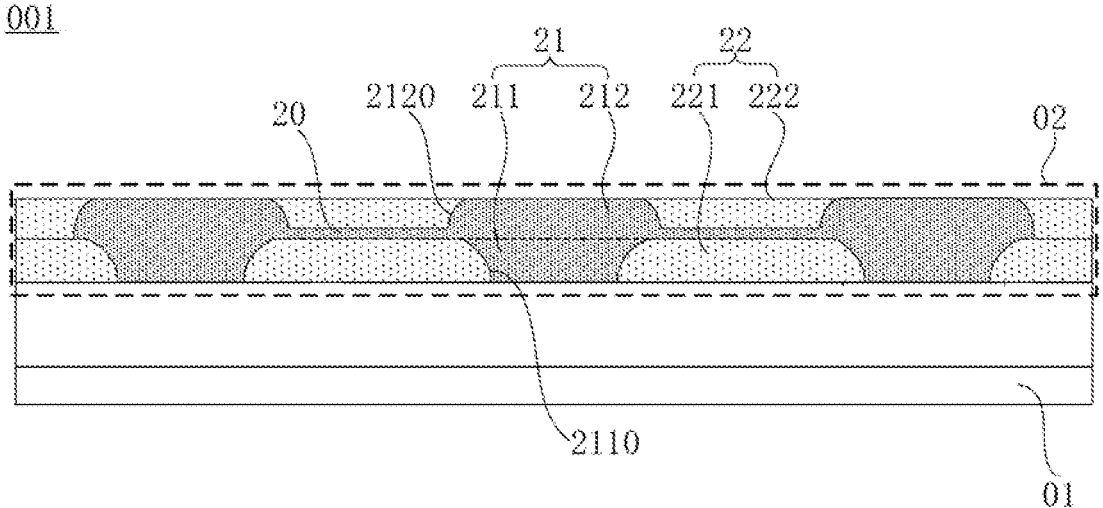
FIG. 3 is a schematic diagram of a display panel according to an embodiment of the present disclosure.

FIG. 3 is a schematic diagram of a display panel according to an embodiment of the present disclosure.

Optionally, as shown in FIG. 3, the light extraction structure 21 may be a whole plane structure, and the light extraction structures 21 form the whole plane structure by means of connecting structures 20. The material of the connecting structure 20 can be the same as the material of the second portion 212.

Since the light extraction structure 21 includes the first portion 211 and the second portion 212 that have different orthographic projection areas, the peripheral structure 22 surrounding the light extraction structure 21 includes a portion 221 surrounding the first portion 211, and a portion 222 surrounding the second portion 212. The portion 221 and the portion 222 of the peripheral structure 22 are in one piece and are made of a same material, or are different layers made of different materials and formed one after another.

Figure 4:
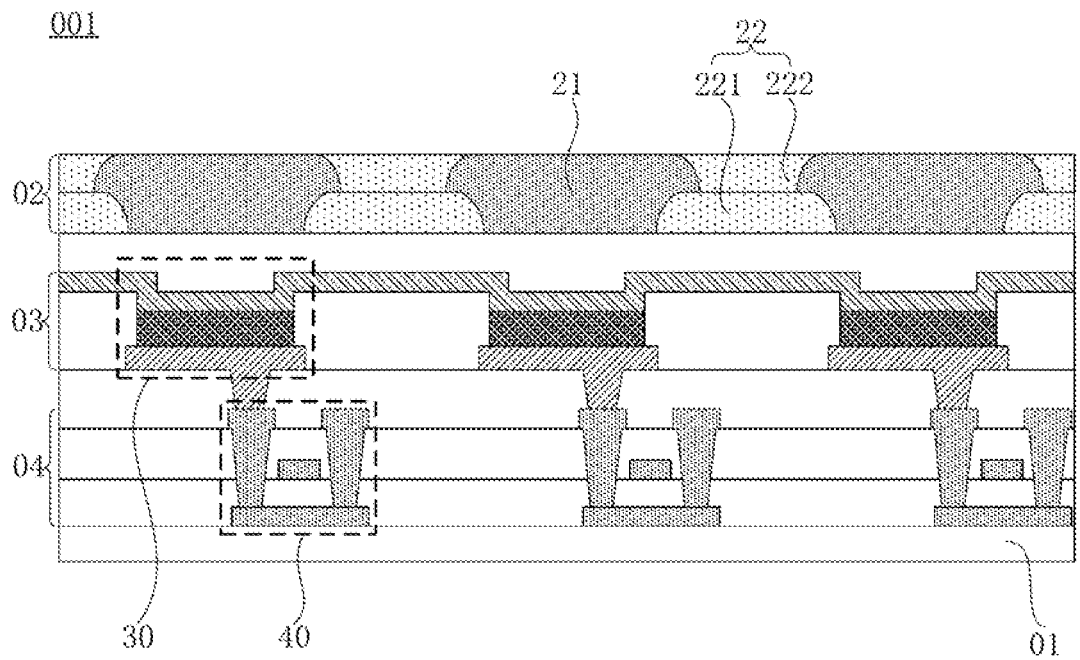
FIG. 4 is a schematic diagram of a display panel according to an embodiment of the present disclosure.

FIG. 4 is a schematic diagram of a display panel according to an embodiment of the present disclosure.

As shown in FIG. 4, the display panel 001 provided by the embodiments of the present disclosure further includes a light-emitting element layer 03 located between the light extraction layer 02 and the substrate 01, that is, the light extraction layer 02 can be disposed at a side of the light-emitting element layer 03 away from the substrate 01. The light-emitting element layer 03 includes multiple light-emitting elements 30, and an orthographic projection of the light extraction structure 21 on the substrate 01 overlaps an orthographic projection of the light-emitting element 30 on the substrate 01, so that the light extraction structure 21 can extract the lights emitted by the light-emitting element 30 that overlaps it.

In the light-emitting element 30 and the light extraction structure 21 with orthographic projections overlapped (the light-emitting element 30 and the light extraction structure 21 corresponding to the light-emitting element 30), an area of the orthographic projection of the second portion 212 on the substrate 01 is greater than an area of the orthographic projection of the light-emitting element 30 on the substrate 01, such that the second portion with a larger area in the light extraction structure 21 completely covers the light-emitting element 30. In this way, the light extraction structure 21 can extract the lights emitted by the light-emitting element 30 as many as possible, and more lights can exit in a front viewing angle direction corresponding to the light-emitting element 30.

The light-emitting element 30 can be at least one of an organic light-emitting diode (OLED), a micro light-emitting diode (Micro-LED), or a mini light-emitting diode (Mini-LED).

In addition, in the light-emitting element 30 and the light extraction structure 21 with orthographic projections overlapped, an area of the orthographic projection of the first portion 211 on the substrate 01 is greater than or equal to an area of the orthographic projection of light-emitting element 30 on the substrate 01, ensuring that the lights emitted by the light-emitting element 30 reach the light extraction structure 21 as many as possible.

In some embodiments of the present disclosure, as shown in FIG. 4, an orthographic projection of the second sidewall 2120 on the substrate 01 does not overlap an orthographic projection of the light-emitting element 30 on the substrate 01. It can be understood that, in the light-emitting element 30 and the light extraction structure 21 with orthographic projections overlapped, the orthographic projection of the second sidewall 2120 on the substrate 01 is located at the periphery of the orthographic projection of the light-emitting element 30 on the substrate 01. Therefore, it is avoided that the second sidewall 2120 changes the light path of the small-angle light that exits at the front viewing angle of the light-emitting element 30, ensuring the light-outgoing amount of the light-emitting element 30 at the front viewing angle.

In addition, an orthographic projection of the first sidewall 2110 on the substrate 01 does not overlap an orthographic projection of the light-emitting element 30 on the substrate 01. It can be understood that in the light-emitting element 30 and the light extraction structure 21 with orthographic projections overlapped, the orthographic projection of the first sidewall 2110 on the substrate 01 is located at the periphery of the orthographic projection of the light-emitting element 30 on the substrate 01. Therefore, it is avoided that the first sidewall 2110 changes the light path of the small-angle light that exits at the front viewing angle of the light-emitting element 30, ensuring the light-outgoing amount of the light-emitting element 30 at the front viewing angle.

The display panel 001 provided in the embodiments of present disclosure can further include a pixel circuit layer 04. The pixel circuit layer 04 includes multiple pixel circuits

40. The pixel circuits 40 are electrically connected to the light-emitting elements 30 and can provide light-emitting driving currents for the light-emitting elements 30.

Figure 5:
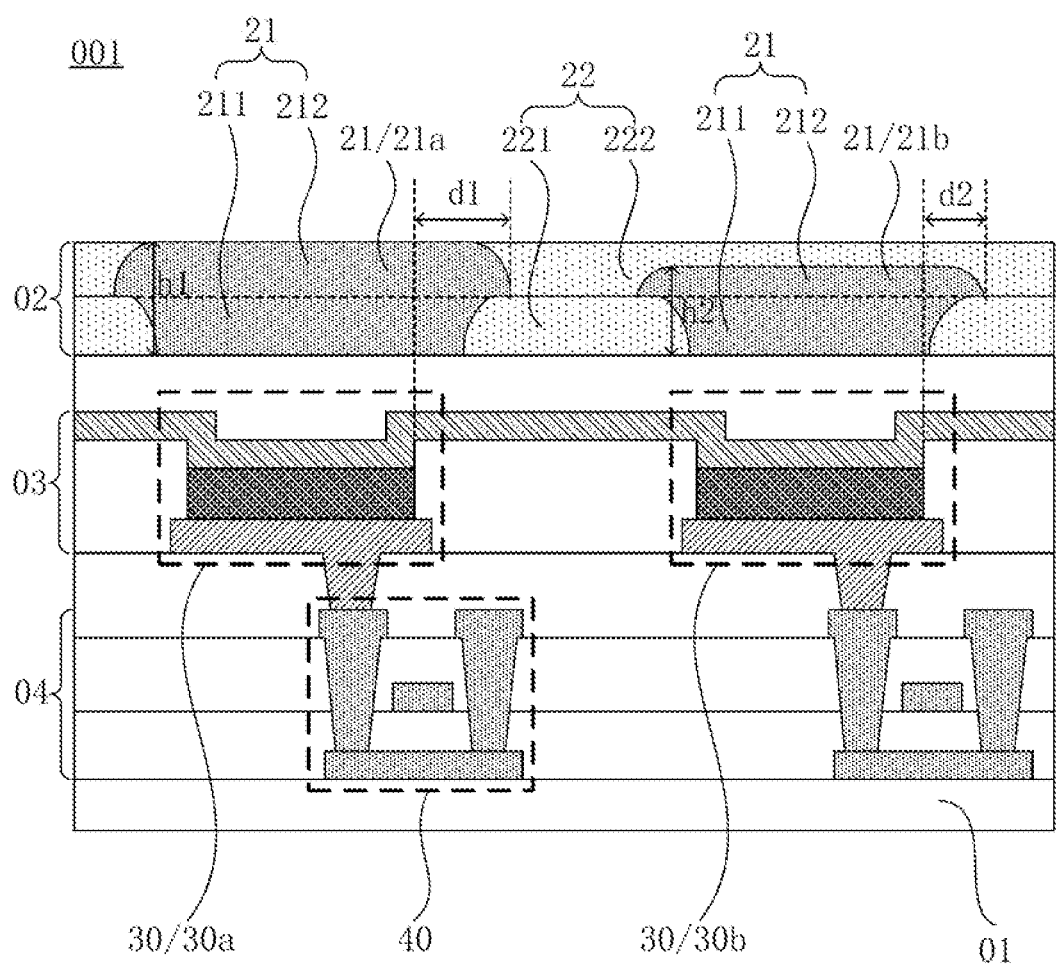
FIG. 5 is a schematic diagram of a display panel according to an embodiment of the present disclosure.

FIG. 5 is a schematic diagram of a display panel according to an embodiment of the present disclosure.

As shown in FIG. 5, the multiple light-emitting elements 30 in the light-emitting element layer 03 include a first light-emitting element 30*a* and a second light-emitting element 30*b*. Correspondingly, the multiple light extraction structures 21 in the light extraction layer 02 include a first light extraction structure 21*a* and a second light extraction structure 21*b*. An orthographic projection of the first light extraction structure 21*a* on the substrate 01 overlaps that of the first light-emitting element 30*a* on the substrate 01, and an orthographic projection of the second light extraction structure 21*b* on the substrate 01 overlaps that of the second light-emitting element 30*b* on the substrate 01. Therefore, the first light extraction structure 21*a* is configured to extract the light emitted by the first light-emitting element 30*a*, and the second light extraction structure 21*b* is configured to extract the light emitted by the second light-emitting element 30*b*.

A distance between an edge of the orthographic projection of the first light extraction structure 21*a* on the substrate 01 and an edge of the orthographic projection of the first light-emitting element 30*a* on the substrate 01 is d1, and a distance between an edge of the orthographic projection of the second light extraction structure 21*b* on the substrate 01 and an edge of the orthographic projection of the second light-emitting element 30*b* on the substrate 01 is d2. In other words, the distance between an edge of the orthographic projection of the second portion 212 of the first light extraction structure 21*a* on the substrate 01 and the edge of the orthographic projection of the first light-emitting element 30*a* on the substrate 01 is d1, and the distance between an edge of the orthographic projection of the second portion 212 of the second light extraction structure 21*b* on the substrate 01 and the edge of the orthographic projection of the second light-emitting element 30*b* on the substrate 01 is d2.

In some embodiments of present disclosure, along a direction perpendicular to the substrate 01, in the first light extraction structure 21*a*, a distance between one end of the second sidewall 2120 away from the first portion 211 and one end of the first portion 211 away from the second portion 212 is h1, and in the second light extraction structure 21*b*, a distance between one end of the second sidewall 2120 away from the first portion 211 and one end of the first portion 211 away from the second portion 212 is h2. It can be understood that the distance in this embodiment is a distance in a direction perpendicular to the substrate 01.

It is configured that d1>d2, and h1>h2. That is, the more the light extraction structure 21 extends beyond the light-emitting element 30 overlapped by the light extraction structure 21 in a direction parallel to the substrate 01, the larger the distance between the top end of the second sidewall 2120 of the light extraction structure 21 and the first portion 211 in the direction perpendicular to the substrate 01 is.

As shown in FIG. 5, the large-angle lights emitted by the light-emitting element 30 are reflected or refracted by the first sidewall 2110 of the first light extraction structure 21*a*, and then transmitted to the second portion 212 and reach the sidewall of the second portion 212 of the first light extraction structure 21*a*. In the direction parallel to the substrate 01, the extending of the first light extraction structure 21*a* with respect to the light-emitting element 30 overlapped by the first light extraction structure 21*a* is larger, and the transmitting paths of these lights have a larger component in the direction parallel to the substrate 01. When the distance, in the direction perpendicular to the substrate 01, between the top end of the second sidewall 2120 in the first light extraction structure 21*a* and the bottom surface of the first portion 211 is larger, more lights reflected or refracted at the first sidewall 2110 of the first light extraction structure 21*a* will be captured by the second sidewall 2120 of the first light extraction structure 21*a*; otherwise, more lights reflected or refracted at the first sidewall 2110 of the first light extraction structure 21*a* will be transmitted and exit above the second sidewall 2120 without passing through the second sidewall 2120.

Figure 6:
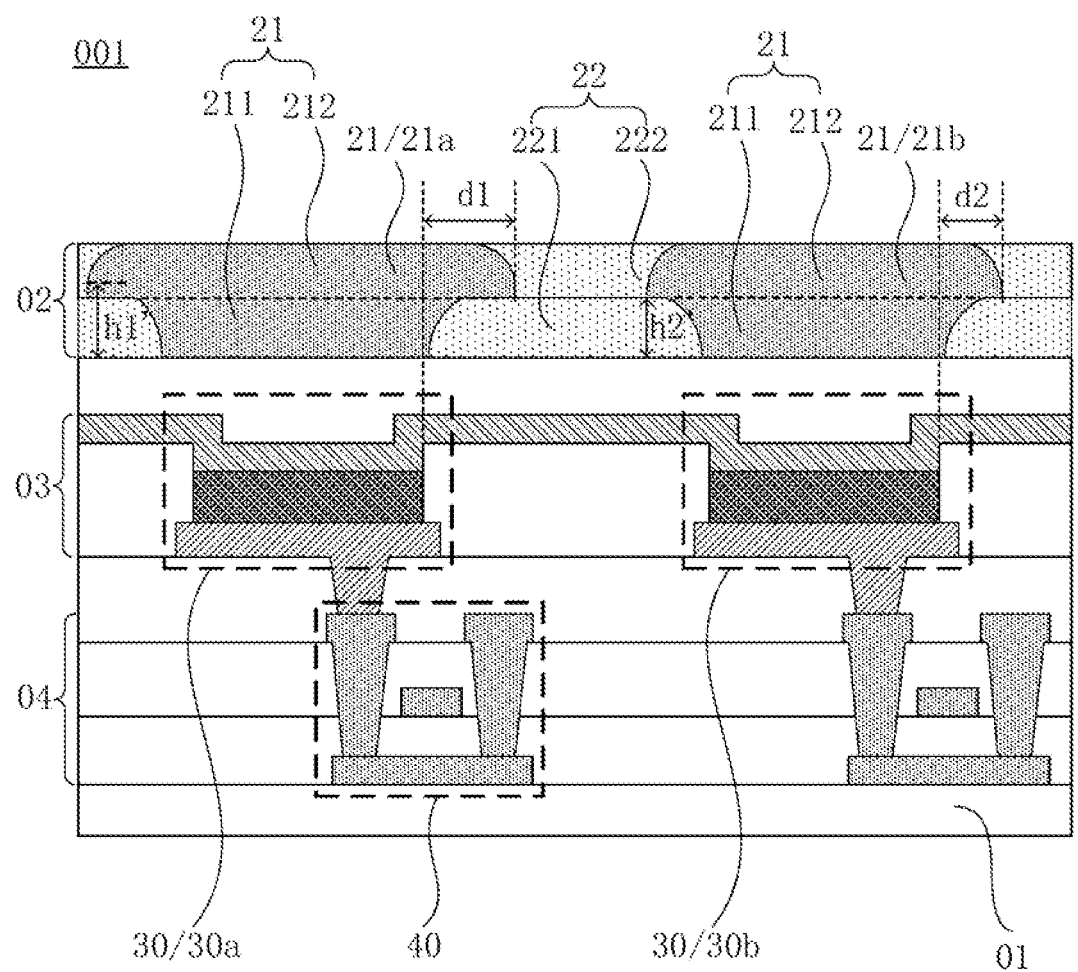
FIG. 6 is a schematic diagram of a display panel according to an embodiment of the present disclosure.

FIG. 6 is a schematic diagram of a display panel according to an embodiment of the present disclosure.

In some embodiments of present disclosure, along a direction perpendicular to the substrate 01, a distance between one end of the second sidewall 2120 adjacent to the first portion 211 and one end of the first portion 211 away from the second portion 212 in the first light extraction structure 21*a* is h1', and a distance between one end of the second sidewall 2120 adjacent to the first portion 211 and one end of the first portion 211 away from the second portion 212 in the second light extraction structure 21*b* is h2'. It can be understood that the distance in this embodiment is a distance in a direction perpendicular to the substrate 01.

It is configured that d1>d2, and h1'>h2'. That is, the more the light extraction structure 21 extends, in the direction parallel to the substrate 01, with respect to the light-emitting element 30 overlapped by the light extraction structure 21, the larger the distance between the bottom end of the second sidewall 2120 in the light extraction structure 21 and the first portion 211 in the direction perpendicular to the substrate 01.

As shown in FIG. 6, the large-angle lights emitted by the light-emitting element 30 are reflected or refracted by the first sidewall 2110 of the first light extraction structure 21*a*, and then transmitted to the second portion 212 and reach the sidewall of the second portion 212 of the first light extraction structure 21*a*. When the extending, in a direction parallel to the substrate 01, of the light extraction structure 21 with respect to the light-emitting element 30 overlapped by the light extraction structure 21 is larger, the transmitting paths of these lights have a larger component in the direction parallel to the substrate 01. When the bottom end of the second sidewall 2120 in the first light extraction structure 21*a* is farther from the first portion 211 in the direction perpendicular to the substrate 01, more lights reflected or refracted at the first sidewall 2110 of the first light extraction structure 21*a* will be captured by the second sidewall 2120 of the first light extraction structure 21*a*.

Figure 7:
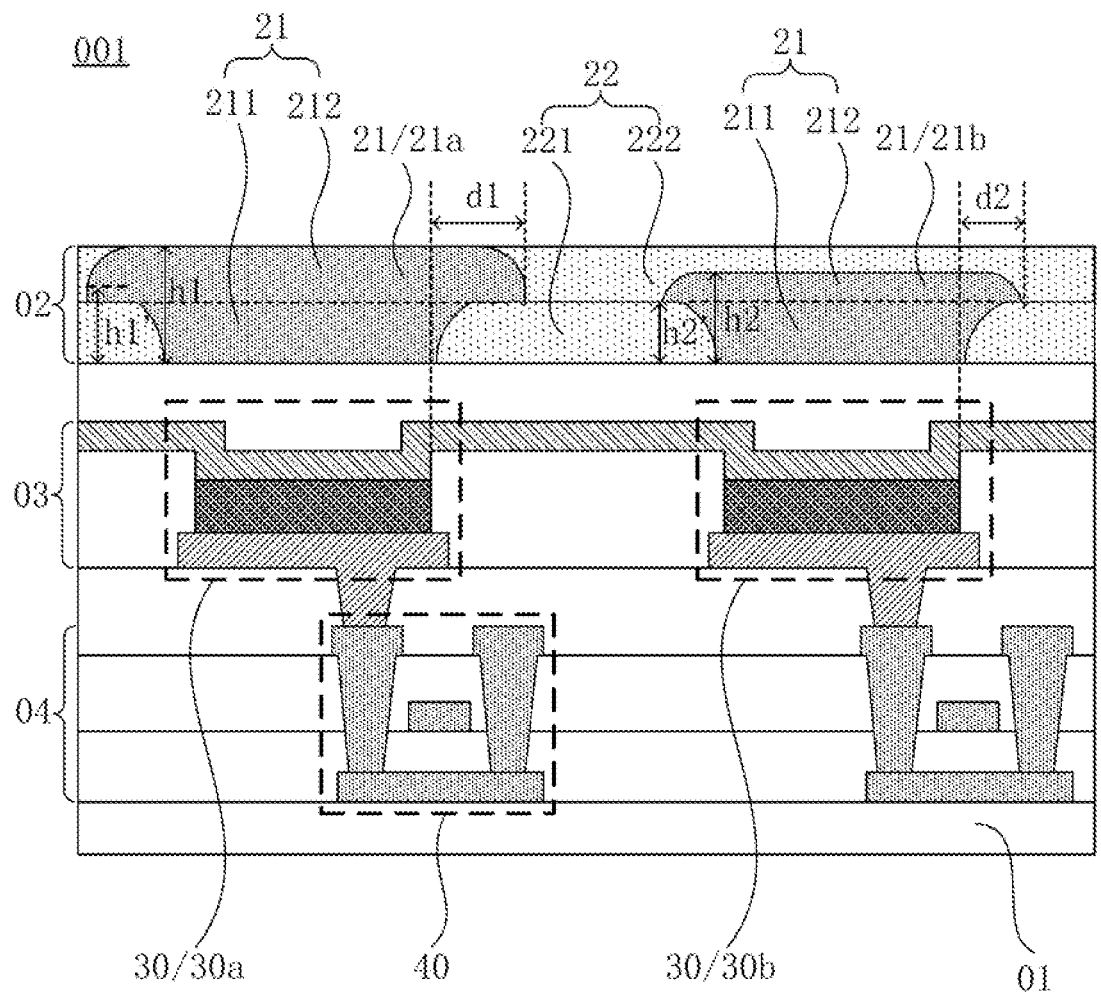
FIG. 7 is a schematic diagram of a display panel according to an embodiment of the present disclosure.

FIG. 7 is a schematic diagram of a display panel according to an embodiment of the present disclosure.

In some embodiments of the present disclosure, d1>d2, h1>h2, and h1'>h2'.

That is, the more the light extraction structure 21 extends, in a direction parallel to the substrate 01, with respect to the light-emitting element 30 overlapped by the light extraction structure 21, the smaller the distance between the bottom end of the second sidewall 2120 in the light extraction structure 21 and the first portion 211 in the direction perpendicular to the substrate 01 is, and the larger the distance between the top end of the second sidewall 2120 in the light extraction structure 21 and the first portion 211 in the direction perpendicular to the substrate 01 is. Therefore, it is ensured that the lights emitted by the first light-emitting element 30*a* can still pass through the second sidewall 2120 as many as possible after the reflection or refraction of the first sidewall 2110 of the first light extraction structure 21a.

Moreover, the more the light extraction structure 21 extends, in a direction parallel to the substrate 01, with respect to the light-emitting element 30 overlapped by the light extraction structure 21, the larger the distance between the top end of the second sidewall 2120 in the light extraction structure 21 and the first portion 211 in the direction perpendicular to the substrate 01 is, and the larger the distance between the bottom end of the second sidewall 2120 in the light extraction structure 21 and the first portion 211 in the direction perpendicular to the substrate 01 is. Therefore, it is ensured that the large-angle lights emitted by the first light-emitting element 30a can still pass through the second sidewall 2120 as many as possible after the reflection or refraction of the first sidewall 2110 of the first light extraction structure 21a. Further, the inclined sidewall in the second portion 212 of the first light extraction structure 21a is not excessively long, avoiding the problem of the increasing reflectivity of the display panel 001 to external lights caused by excessively larger width of the second portion 212 in the direction parallel to the substrate 01.

The minimum distances between different points in the edge of orthographic projection of the first light extraction structure 21a on the substrate 01 and the edge of the orthographic projection of the first light-emitting element 30a on the substrate 01 can be the same or different. The edge of orthographic projection of the first light extraction structure 21a on the substrate 01 may include points having different minimum distances to the edge of the orthographic projection of the first light-emitting element 30a on the substrate 01, and points having the same minimum distance to the edge of the orthographic projection of the first light-emitting element 30a on the substrate 01. The distance d1 between the edge of orthographic projection of the first light extraction structure 21a on the substrate 01 and the edge of the orthographic projection of the first light-emitting element 30a on the substrate 01 refers to the minimum distance between the group of points in the edge of orthographic projection of the first light extraction structure 21a on the substrate 01 and the edge of the orthographic projection of the first light-emitting element 30a on the substrate 01. The group of points have a same minimum distance to the edge of the orthographic projection of the first light-emitting element 30a, and the number of the points in this group is largest among the point groups in the edge of orthographic projection of the first light extraction structure 21a on the substrate 01 each of which has a same minimum distance to the edge of the orthographic projection of the first light-emitting element 30a. Or the distance d1 between the edge of orthographic projection of the first light extraction structure 21a on the substrate 01 and the edge of the orthographic projection of the first light-emitting element 30a on the substrate 01 refers to an average of the minimum distances between all points in the edge of the orthographic projection of the first light extraction structure 21a on the substrate 01 and the edge of the orthographic projection of the first light-emitting element 30a on the substrate 01.

The minimum distances between different points in the edge of orthographic projection of the second light extraction structure 21b on the substrate 01 and the edge of the orthographic projection of the second light-emitting element 30b on the substrate 01 can be the same or different. The edge of orthographic projection of the second light extraction structure 21b on the substrate 01 may include points having different minimum distances to the edge of the orthographic projection of the second light-emitting element 30b on the substrate 01, and points having the same minimum distance to the edge of the orthographic projection of the second light-emitting element 30b on the substrate 01. The distance d2 between the edge of the orthographic projection of the second light extraction structure 21b on the substrate 01 and the edge of the orthographic projection of the second light-emitting element 30b on the substrate 01 refers to the minimum distance between a group of points in the edge of orthographic projection of the second light extraction structure 21b on the substrate 01 and the edge of the orthographic projection of the second light-emitting element 30b on the substrate 01. This group of points have a same minimum distance to the edge of the orthographic projection of the second light-emitting element 30b, and the number of the points in this group is largest among the point groups in the edge of orthographic projection of the second light extraction structure 21b on the substrate 01 each of which has a same minimum distance to the edge of the orthographic projection of the second light-emitting element 30b. Or the distance d2 between the edge of the orthographic projection of the second light extraction structure 21b on the substrate 01 and the edge of the orthographic projection of the second light-emitting element 30b on the substrate 01 refers to an average of the distances between all points in the edge of the orthographic projection of the second light extraction structure 21b on the substrate 01 and the edge of the orthographic projection of the second light-emitting element 30b on the substrate 01.

Figure 8:
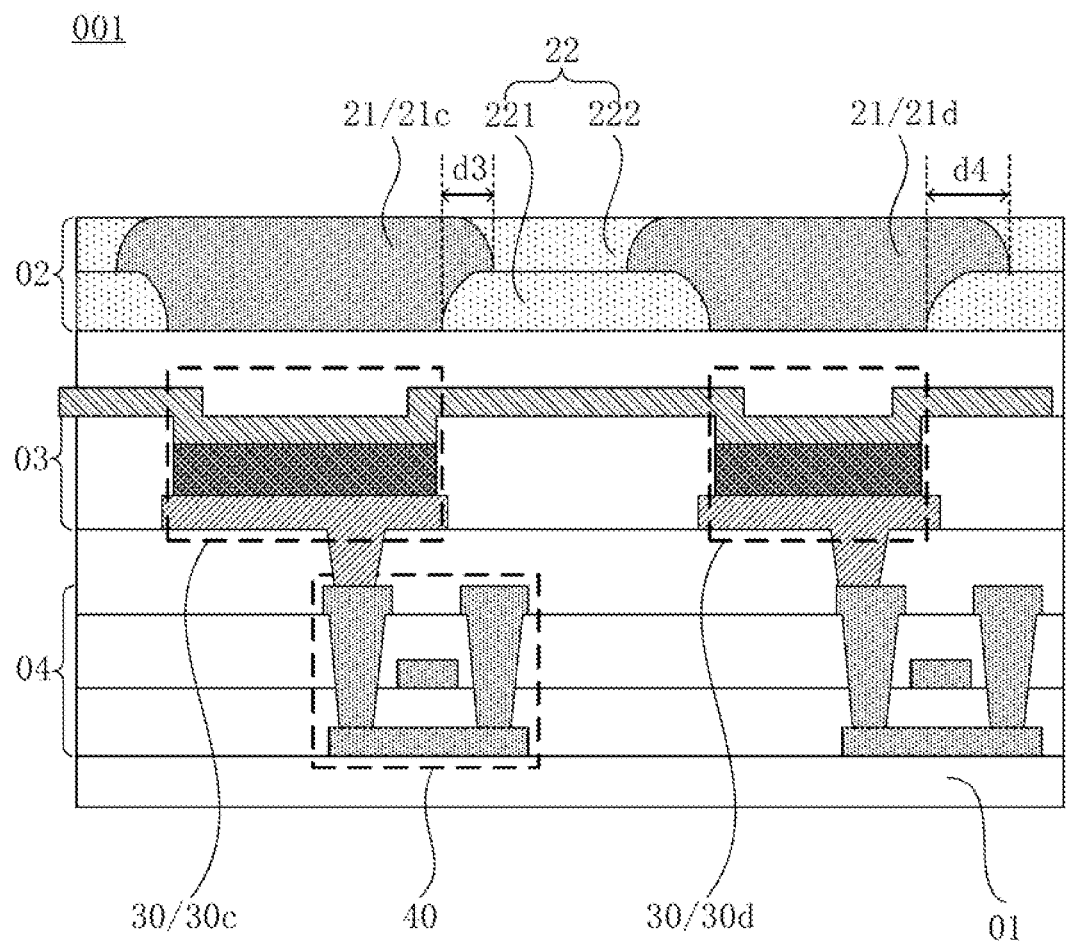
FIG. 8 is a schematic diagram of a display panel according to an embodiment of the present disclosure.

FIG. 8 is a schematic diagram of a display panel according to an embodiment of the present disclosure.

As shown in FIG. 8, the multiple light-emitting elements 30 included in the light-emitting element layer 03 include a third light-emitting element 30c and a fourth light-emitting element 30d. A light-emitting area of the third light-emitting element 30c is greater than a light-emitting area of the fourth light-emitting element 30d. Correspondingly, the multiple light extraction structures 21 included in the light extraction layer 02 include a third light extraction structure 21c and a fourth light extraction structure 21d. The orthographic projection of the third light extraction structure 21c on the substrate 01 overlaps the orthographic projection of the third light-emitting element 30c on the substrate 01, and the orthographic projection of the fourth light extraction structure 21d on the substrate 01 overlaps the orthographic projection of the fourth light-emitting element 30d on the substrate 01. The third light extraction structure 21c is configured to extract the light emitted by the third light-emitting element 30c, and the fourth light extraction structure 21d is configured to extract the light emitted by the fourth light-emitting element 30d.

In an embodiment, as shown in FIG. 8, in the orthographic projections of the first sidewall 2110 and the second sidewall 2120 included in the third light extraction structure 21c on the substrate 01, a distance between one end of the orthographic projection of the first sidewall 2110 away from the orthographic projection of the second sidewall 2120 and one end of the orthographic projection of the second sidewall 2120 away from the orthographic projection of the first sidewall 2110 is defined as d3. It can be understood that a width of the orthographic projection, on the substrate 01, of a portion of the inclined sidewall in the third light extraction structure 21c is d3.

In the orthographic projections of the first sidewall 2110 and the second sidewall 2120 included in the fourth light extraction structure 21d on the substrate 01, a distance between one end of the orthographic projection of the first sidewall 2110 away from the orthographic projection of the second sidewall 2120 and one end of the orthographic projection of the second sidewall 2120 away from the orthographic projection of the first sidewall 2110 is defined as d4. It can be understood that a width of the orthographic projection of a portion of the inclined sidewall included in the fourth light extraction structure 21*d* is d4.

It is configured that d3≤d4. In the light extraction structure 21 above the light-emitting element 30 with a greater light-emitting area, in a direction parallel to the substrate 01, the distance between one end of the first sidewall 2110 away from the second sidewall 2120 and one end of the second sidewall 2120 away from the first sidewall 2110 is smaller.

If the light extraction structures 21 above the light-emitting elements 30 having different light-emitting areas use the same design, the light extraction effect of the light extraction structure 21 corresponding to the light-emitting element 30 having a smaller light-emitting area will be greater than the light extraction effect of the light extraction structure 21 corresponding to the light-emitting element 30 having a larger light-emitting area. This is because the large-angle lights emitted by the light-emitting element 30 having a smaller light-emitting area will be more intensively captured by the light extraction structure 21 above the light-emitting element 30 and converted into small-angle lights.

By designing the portion, including the inclined sidewall and used for achieving a function of light extraction, in the light extraction structure 21 corresponding to the light-emitting element 30 having a larger light-emitting area to be narrow, more large-angle lights emitted by the light-emitting element 30 can be captured, so that the light extraction effect of the light extraction structure 21 for the lights emitted by the light-emitting element 30 having a larger light-emitting area is improved, further balancing the brightness of sub-pixels corresponding to the light-emitting elements 30 having different light-emitting areas.

For example, the light-emitting area of the blue light-emitting element 30 is greater than that of the green light-emitting element 30, and the light-emitting area of the green light-emitting element 30 is greater than that of the red light-emitting element 30. In a direction parallel to the substrate 01, a distance between one end of the first sidewall 2110 of the light extraction structure 21 corresponding to the blue light-emitting element 30 away from the second sidewall 2120 and one end of the second sidewall 2120 of the light extraction structure 21 corresponding to the blue light-emitting element 30 away from the first sidewall 2120 is smaller than a distance between one end of the first sidewall 2110 of the light extraction structure 21 corresponding to the green light-emitting element 30 away from the second sidewall 2120 and one end of the second sidewall 2120 of the light extraction structure 21 corresponding to the green light-emitting element 30 away from the first sidewall 2120, and a distance between one end of the first sidewall 2110 of the light extraction structure 21 corresponding to the green light-emitting element 30 away from the second sidewall 2120 and one end of the second sidewall 2120 away from the first sidewall 2120 is smaller than a distance between one end of the first sidewall 2110 of the light extraction structure 21 corresponding to the red light-emitting element 30 away from the second sidewall 2120 and one end of the second sidewall 2120 away from the first sidewall 2120.

An edge of the orthographic projection of the first sidewall 2110 on the substrate 01 away from the orthographic projection of the second sidewall 2120 on the substrate 01 is a first edge, and an edge of the orthographic projection of the second sidewall 2120 on the substrate 01 away from the orthographic projection of the first sidewall 2110 on the substrate 01 is a second edge.

Then, in the orthographic projection of the third light extraction structure 21*c*, different points of the first edge may have a same minimum distance to the second edge or have different minimum distances to the second edge. The first edge of the third light extraction structure 21*c* includes points having different minimum distances to the second edge. The distance d3 between one end of the orthographic projection of the first sidewall 2110 away from the orthographic projection of the second sidewall 2120 and one end of the orthographic projection of the second sidewall 2120 away from the orthographic projection of the first sidewall 2110 refers to the minimum distance between the group of points in the first edge of the third light extraction structure 21*c* and the second edge. The group of points have a same minimum distance to the second edge, and the number of the points in this group is largest among the point groups each including multiple points having the same minimum distance to the second edge. Or the distance d3 refers to an average of distances between all points of the first edge and the second edge of the third light extraction structure 21*c*.

Then, in the orthographic projection of the fourth light extraction structure 21*d*, the minimum distances between the different points of the first edge and the second edge can be the same or different. The first edge of the fourth light extraction structure 21*d* includes points having different minimum distances to the second edge. The distance d4 between one end of the orthographic projection of the first sidewall 2110 away from the orthographic projection of the second sidewall 2120 and one end of the orthographic projection of the second sidewall 2120 away from the orthographic projection of the first sidewall 2110 refers to the minimum distance between the group of points in the first edge of the fourth light extraction structure 21*d* and the second edge. This group of points have a same minimum distance to the second edge, and the number of the points in this group is largest among the point groups each including multiple points having the same minimum distance to the second edge. Or the distance d4 refers to an average of distances between all points of the first edge and the second edge of the fourth light extraction structure 21*d*.

Figure 9:
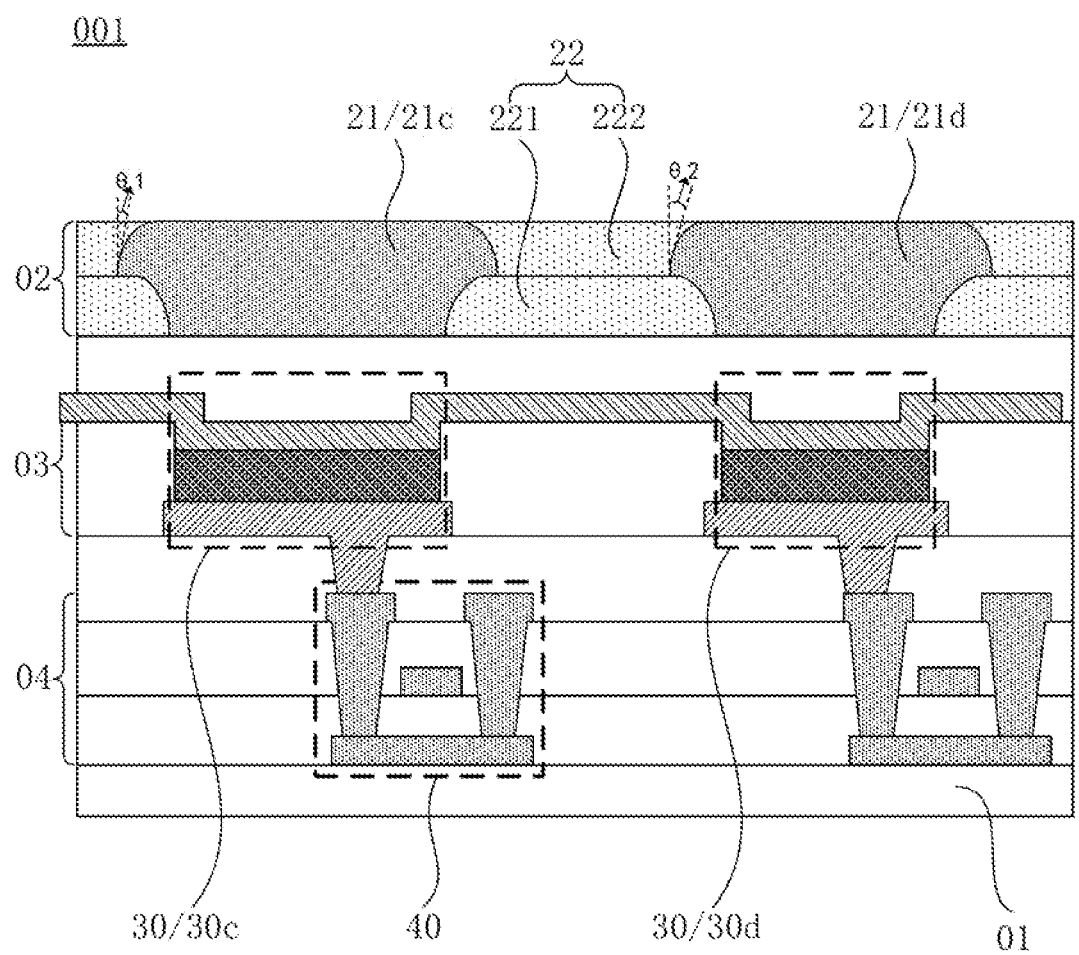
FIG. 9 is a schematic diagram of a display panel according to an embodiment of the present disclosure.
Figure 10:
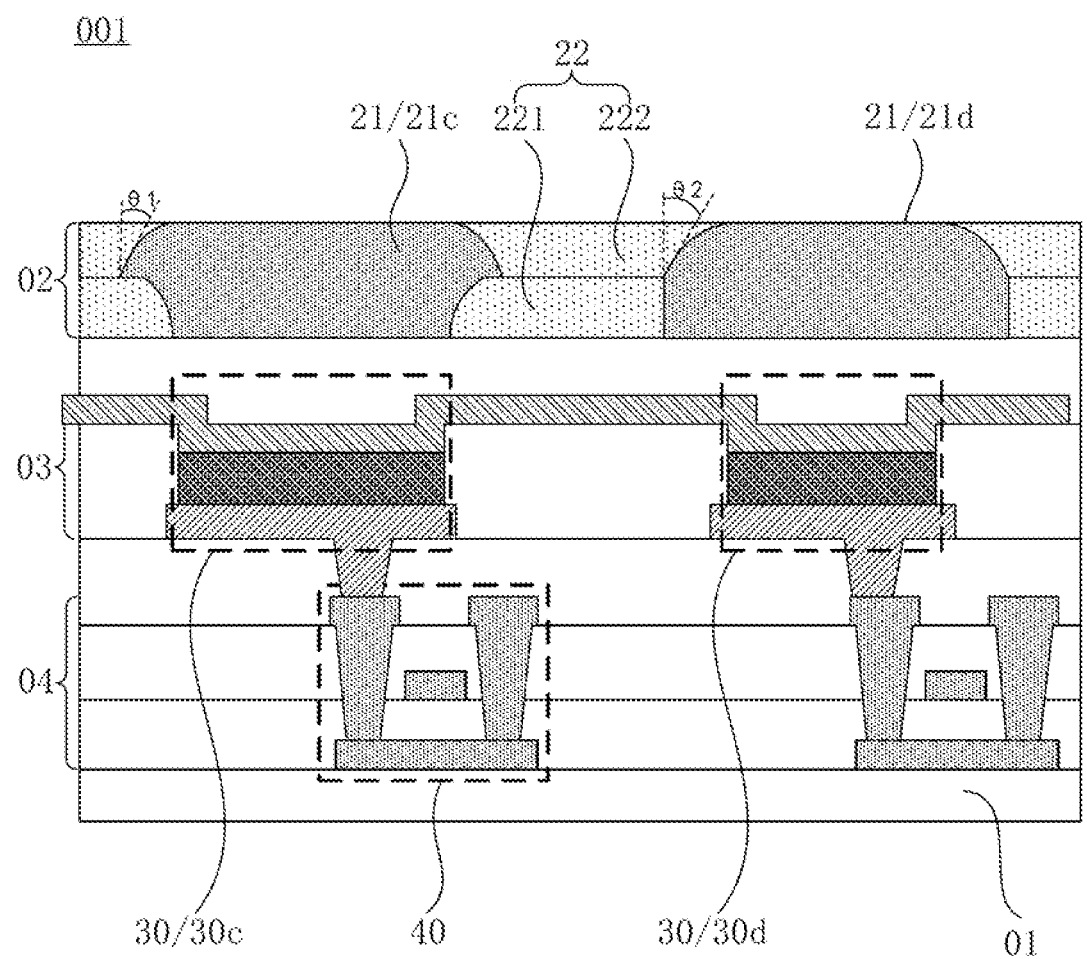
FIG. 10 is a schematic diagram of a display panel according to an embodiment of the present disclosure.

FIG. 9 is a schematic diagram of a display panel according to an embodiment of the present disclosure, and FIG. 10 is a schematic diagram of a display panel according to an embodiment of the present disclosure.

In an embodiment, as shown in FIG. 9 and shown in FIG. 10, a sidewall having a spatially varying curvature in the second sidewall 2120 of the light extraction structure is a first sub-sidewall, and minimum angles formed between the first axis and the sections of the first sidewalls corresponding to the light-emitting elements 30 with different light-emitting areas can be different.

It should be noted that the first sub-sidewall is a curved surface, and the minimum angles between the first axis Z1 and the sections of the first sub-sidewalls in different second sidewalls 2120 can be different.

As shown in FIG. 9 and FIG. 10, a minimum angle formed between a section of the first sub-sidewall in the second sidewall 2120 of the third light extraction structure 21*c* and the first axis Z1 is defined as θ1, and a minimum angle formed between a section of the first sub-sidewall in the second sidewall 2120 of the fourth light extraction structure 21*d* and the first axis is defined as θ2. Since the third light-emitting element 30*c* and the fourth light-emitting element 30*d* have different light-emitting areas, θ1 and θ2 are different.

In a technical solution corresponding to this embodiment, as shown in FIG. 9, when both θ1 and θ2 are smaller than a preset value, θ1>θ2. That is, when a minimum angle formed between a section of the first sub-sidewall in the second sidewall 2120 of the third light extraction structure 21c and the first axis Z1, and a minimum angle formed between a section of the first sub-sidewall in the second sidewall 2120 of the fourth light extraction structure 21d and the first axis Z1 are both smaller than a preset value, the minimum angle formed between a section of the first sub-sidewall in the second sidewall 2120 of the third light extraction structure 21c and the first axis Z1 is smaller than the minimum angle formed between a section of the first sub-sidewall in the second sidewall 2120 of the fourth light extraction structure 21d and the first axis Z1. The preset value can be 35°.

In this technical solution, the larger the light-emitting area of the light extraction structure 21 is, the larger the minimum angle formed between the first axis Z1 and the section of the first sub-sidewall having a spatially varying curvature in the second sidewall 2120 of the light extraction structure 21 above the light-emitting element 30 is larger.

For example, when the light-emitting area of the blue light-emitting element 30 is greater than that of the green light-emitting element 30, and the light-emitting area of the green light-emitting element 30 is greater than that of the red light-emitting element 30, the minimum angle formed between a section of the first sub-sidewall in the second sidewall 2120 of the light extraction structure 21 corresponding to the blue light-emitting element 30 and the first axis Z1 is smaller than a preset value, the minimum angle formed between a section of the first sub-sidewall in the second sidewall 2120 of the light extraction structure 21 corresponding to the green light-emitting element 30 and the first axis Z1 is smaller than the preset value, and the minimum angle formed between a section of the first sub-sidewall in the second sidewall 2120 of the light extraction structure 21 corresponding to the red light-emitting element 30 and the first axis Z1 is smaller than the preset value. The minimum angle formed between a section of the first sub-sidewall in the second sidewall 2120 of the light extraction structure 21 corresponding to the blue light-emitting element 30 and the first axis Z1 is greater than the minimum angle formed between a section of the first sub-sidewall in the second sidewall 2120 of the light extraction structure 21 corresponding to the green light-emitting element 30 and the first axis Z1, and the minimum angle formed between a section of the first sub-sidewall in the second sidewall 2120 of the light extraction structure 21 corresponding to the green light-emitting element 30 and the first axis Z1 is greater than the minimum angle formed between a section of the first sub-sidewall in the second sidewall 2120 of the light extraction structure 21 corresponding to the red light-emitting element 30 and the first axis Z1.

In a technical solution corresponding to this embodiment, as shown in FIG. 10, when θ1 and θ2 are both greater than the preset value, θ1<θ2. That is, when a minimum angle formed between a section of the first sub-sidewall in the second sidewall of the third light extraction structure 21c and the first axis Z1, and a minimum angle formed between a section of the first sub-sidewall in the second sidewall 2120 of the fourth light extraction structure 21d and the first axis Z1 are both greater than a preset value, the minimum angle formed between a section of the first sub-sidewall in the second sidewall of the third light extraction structure 21c and the first axis Z1 is less than the minimum angle formed between a section of the first sub-sidewall in the second sidewall of the fourth light extraction structure 21d and the first axis Z1. The preset value is 35°.

In this technical solution, the minimum angle formed between the section of the first sub-wall in the second sidewall 2120 of the light extraction structure 21 above the light-emitting element 30 with a larger light-emitting area and the first axis Z1 is smaller.

For example, when the light-emitting area of the blue light-emitting element 30 is greater than that of the green light-emitting element 30, and the light-emitting area of the green light-emitting element 30 is greater than that of the red light-emitting element 30, the minimum angle formed between a section of the first sub-sidewall in the second sidewall 2120 of the light extraction structure 21 corresponding to the blue light-emitting element 30 and the first axis Z1 is greater than a preset value, the minimum angle formed between a section of the first sub-sidewall in the second sidewall 2120 of the light extraction structure 21 corresponding to the green light-emitting element 30 and the first axis Z1 is greater than the preset value, and the minimum angle formed between a section of the first sub-sidewall in the second sidewall 2120 of the light extraction structure 21 corresponding to the red light-emitting element 30 and the first axis Z1 is greater than the preset value. The minimum angle formed between a section of the first sub-sidewall in the second sidewall 2120 of the light extraction structure 21 corresponding to the blue light-emitting element 30 and the first axis Z1 is smaller than the minimum angle formed between a section of the first sub-sidewall in the second sidewall 2120 of the light extraction structure 21 corresponding to the green light-emitting element 30 and the first axis Z1, and the minimum angle formed between a section of the first sub-sidewall in the second sidewall 2120 of the light extraction structure 21 corresponding to the green light-emitting element 30 and the first axis Z1 is smaller than the minimum angle formed between a section of the first sub-sidewall in the second sidewall 2120 of the light extraction structure 21 corresponding to the red light-emitting element 30 and the first axis Z1.

When other parameters are fixed, the minimum angle formed between the section of the first sub-sidewall in the second sidewall of the light extraction structure 21 has no positive correlation or negative correlation relationship with the light extraction ability. When the minimum angle formed between a section of the first sub-sidewall in the second sidewall 2120 of the light extraction structure 21 and the first axis Z1 is smaller than a preset value, the greater the minimum angle formed between a section of the first sub-sidewall in the second sidewall 2120 of the light extraction structure 21 and the first axis Z1, the stronger the light extraction ability of the light extraction structure 21. When the minimum angle formed between a section of the first sub-sidewall in the second sidewall 2120 of the light extraction structure 21 and the first axis Z1 is greater than a preset value, the smaller the minimum angle formed between a section of the first sub-sidewall in the second sidewall 2120 of the light extraction structure 21 and the first axis Z1, the stronger the light extraction ability of the light extraction structure 21.

In addition, the light-emitting element 30 with a lower light-emitting efficiency has a larger light-emitting area. Therefore, in some embodiments of the present disclosure, the light extraction structures 21 above the light-emitting elements with different light-emitting areas are configured to have different minimum angles between the first axis Z1 and the sections of the first sub-sidewalls in the second sidewalls 2120, which can effectively balance the brightness of the sub-pixels corresponding to the light-emitting elements 30 with different light-emitting areas.

Figure 11:
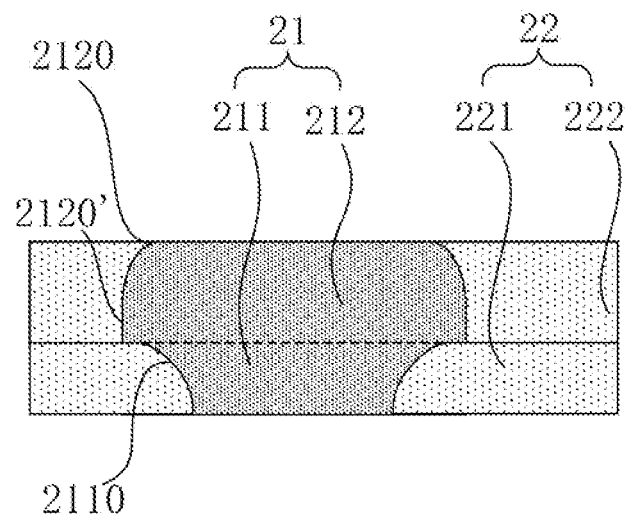
FIG. 11 is a schematic diagram of a light extraction structure in a display panel according to an embodiment of the present disclosure.

FIG. 11 is a schematic diagram of a light extraction structure in a display panel according to an embodiment of the present disclosure.

In some embodiments, the second portion 212 in at least one light extraction structure 21 includes a third sidewall 2120'. As shown in FIG. 11, the third sidewall 2120' is located at one end of the second sidewall 2120 adjacent to the first wall 2110 and is parallel to the first axis Z1. That is, the vertical third sidewall 2120' is disposed between the first sidewall 2110 and the second sidewall 2120.

By disposing the third sidewall 2120', a distance between the bottom of the second sidewall 2120 and the first sidewall 2110 in a direction perpendicular to the substrate 01 and a distance between the top of the second sidewall 2120 and the first sidewall 2110 in the direction perpendicular to the substrate 01 can be adjusted, and when the distance between the top of the second sidewall 2120 and the first sidewall 2110 in the direction perpendicular to the substrate 01 increases, an area of an extending portion of the second portion 212 of the light extraction structure 21 relative to the first portion 211 in a direction parallel to the substrate 01 will not increase too much.

The structure solution of the light extraction structure 21 provided by this embodiment can be applied to any scenario corresponding to FIG. 5 and FIG. 7.

Figure 12:
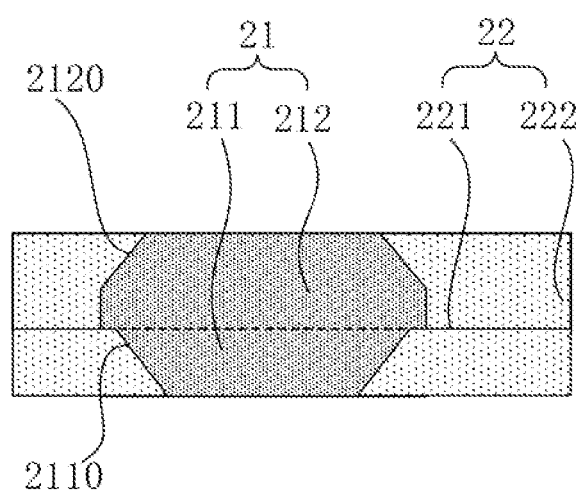
FIG. 12 is a schematic diagram of a light extraction structure in a display panel according to an embodiment of the present disclosure.
Figure 13:
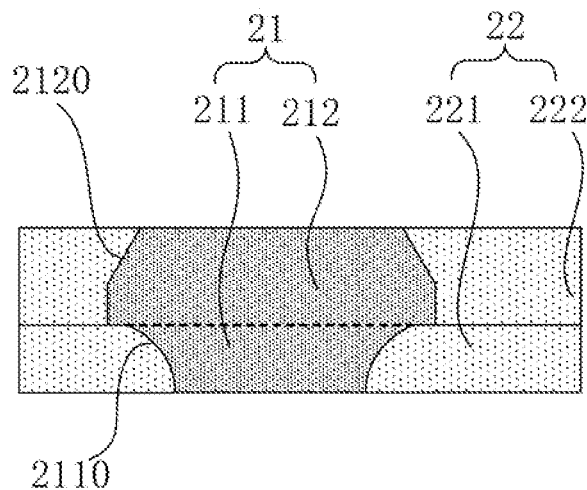
FIG. 13 is a schematic diagram of a light extraction structure in a display panel according to an embodiment of the present disclosure.
Figure 14:
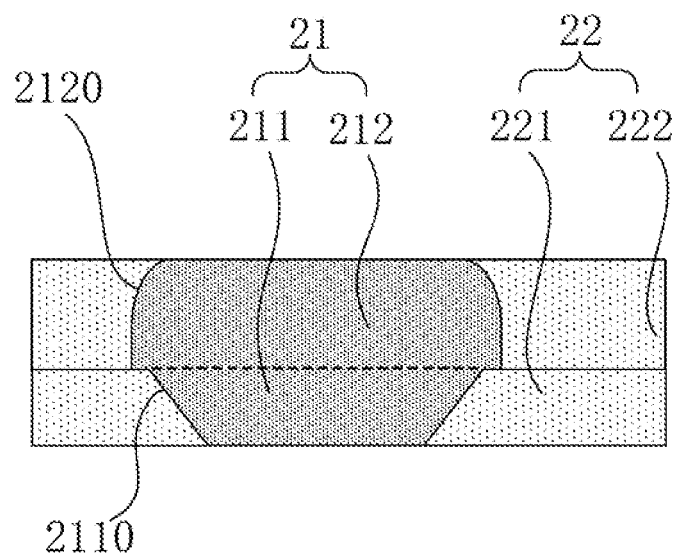
FIG. 14 is a schematic diagram of a light extraction structure in a display panel according to an embodiment of the present disclosure.

FIG. 12 is a schematic diagram of a light extraction structure in a display panel according to an embodiment of the present disclosure, FIG. 13 is a schematic diagram of a light extraction structure in a display panel according to an embodiment of the present disclosure, and FIG. 14 is a schematic diagram of a light extraction structure in a display panel according to an embodiment of the present disclosure.

As shown in FIG. 11 to FIG. 14, the first sidewall 2110 of the first portion 211 in the light extraction structure 21 is a planar structure, and/or the second sidewall 2120 of the second portion of 212 in the light extraction structure 21 is a planar structure.

As shown in FIG. 11 to FIG. 14, the first sidewall 2110 of the first portion 211 in the light extraction structure 21 is a curved surface structure and protrudes away from the peripheral structure 22, and/or the second sidewall 2120 of the second portion of 212 in the light extraction structure 21 is a curved surface structure and protrudes away from the peripheral structure 22.

In some embodiments, as shown in FIG. 11, the first sidewall 2110 of the first portion 211 of the light extraction structure 21 is a curved surface structure protruding away from the peripheral structure 22; and the second sidewall 2120 in the second portion 212 of the light extraction structure 21 is a curved surface structure protruding away from the peripheral structure 22.

In some embodiments, as shown in FIG. 12, the first sidewall 2110 in the first portion 211 of the light extraction structure 21 is a planar structure; and the second sidewall 2120 in the second portion 212 of the light extraction structure 21 is a planar structure.

In some embodiments, as shown in FIG. 13, the first sidewall 2110 in the first portion 211 of the light extraction structure 21 is a curved surface structure protruding away from the peripheral structure 22; and the second sidewall 2120 in the second portion 212 of the light extraction structure 21 is a planar structure.

In some embodiments, as shown in FIG. 14, the first sidewall 2110 in the first portion 211 of the light extraction structure 21 is a planar structure; and the second sidewall 2120 in the second portion 212 of the light extraction structure 21 is a curved surface structure protruding away from the peripheral structure 22.

In some embodiments, in a same light extraction structure 21, the inclination degree of the first sidewall 2110 relative to the first axis Z1 is smaller than the inclination degree of the second sidewall 2120 relative to the first axis Z1. The first sidewall 2110 can receive more lights emitted by the light-emitting element 30 and incident from a side of the first sidewall 2110, i.e., the first sidewall 2110 can convert more large-angle lights into lights with reduced angles. The second sidewall 2120 can receive more lights that change the light path after passing through the first sidewall 2110 and incident from the bottom of the second sidewall 2120, i.e., the second sidewall 2120 further modifies the angle of more exiting lights.

Figure 15:
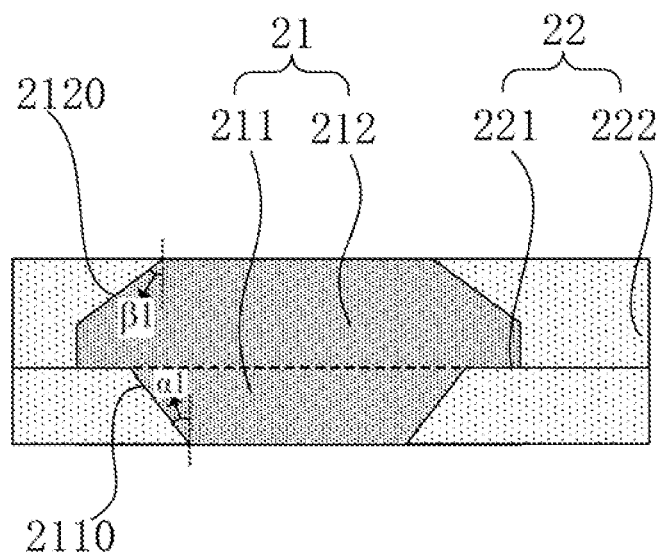
FIG. 15 is a schematic diagram of a light extraction structure in a display panel according to an embodiment of the present disclosure.

FIG. 15 is a schematic diagram of a light extraction structure in a display panel according to an embodiment of the present disclosure.

As shown in FIG. 15, an angle formed between the first sidewall 2110 and the first axis Z1 is $\alpha 1$, an angle formed between the second sidewall 2120 and the first axis Z1 is $\beta 1$, and in a same light extraction structure 21, $\alpha 1 < \beta 1$.

Figure 16:
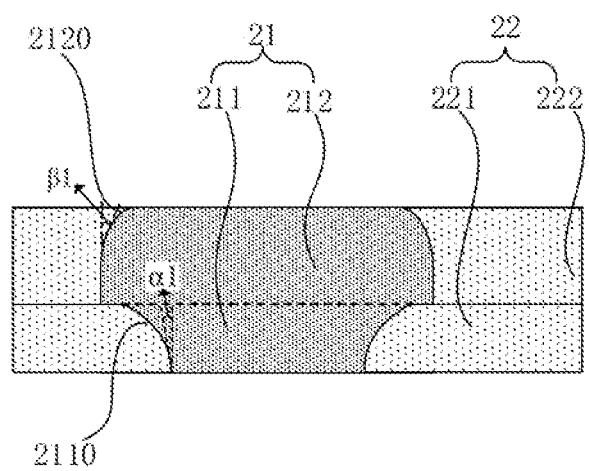
FIG. 16 is a schematic diagram of a light extraction structure in a display panel according to an embodiment of the present disclosure.

FIG. 16 is a schematic diagram of a light extraction structure in a display panel according to an embodiment of the present disclosure.

As shown in FIG. 16, when the first sidewall 2110 is a curved surface structure protruding away from the peripheral structure 22, the angle $\alpha 1$ formed between the first sidewall 2110 and the first axis Z1 can be the minimum angle formed between a section of the second sub-sidewall in the first sidewall 2110 and the first axis Z1. The second sub-sidewall is the portion with a spatially varying curvature in the first sidewall.

As shown in FIG. 16, when the second sidewall 2120 is a curved surface structure protruding away from the peripheral structure 22, the angle β1 formed between the second sidewall 2120 and the first axis Z1 can be the minimum angle formed between a section of the first sub-sidewall in the second sidewall 2120 and the first axis Z1. The first sub-sidewall is the portion with a spatially varying curvature in the second sidewall.

When the first sidewall 2110 and the second sidewall 2120 are both curved surface structures, in the same light extraction structure 21, $\alpha 1 < \beta 1$, that is, the minimum angle formed between the section of the second sub-sidewall in the first sidewall 2110 and the first axis Z1 is smaller than the minimum angle formed between the section of the first sub-sidewall in the second sidewall 2120 and the first axis Z1.

When the first sidewall 2110 is a curved surface structure and the second sidewall 2120 is a planar structure, in the same light extraction structure 21, $\alpha 1 < \beta 1$, that is, the minimum angle formed between the first sidewall 2110 and the first axis Z1 is smaller than the angle formed between the second sidewall 2120 and the first axis Z1.

When the first sidewall 2110 is a planar structure and the second sidewall 2120 is a curved surface structure, in the same light extraction structure 21, $\alpha 1 < \beta 1$, that is, the angle formed between the section of the second sub-sidewall in the first sidewall 2110 and the first axis Z1 is smaller than the minimum angle formed between the section of the first sub-sidewall in the second sidewall 2120 and the first axis Z1.

In some technical solutions corresponding to this embodiment, $15° \leq \alpha 1 \leq 45°$, that is, the angle formed between the first sidewall 2110 and the first axis Z1 is greater than or equal to 15° and smaller than or equal to 45°.

When the first sidewall 2110 is a curved surface structure protruding away from the peripheral structure 22, the minimum angle formed between the section of the second sub-sidewall in the first sidewall 2110 and the first axis Z1 is greater than or equal to 15° and smaller than or equal to 45°.

In some embodiments, 35°≤α1≤45°.

In some technical solutions corresponding to this embodiment, 35°≤β1≤55°, i.e., the angle formed between the second sidewall 2120 and the first axis Z1 is greater than or equal to 35° and smaller than or equal to 55°.

When the second sidewall 2120 is a curved surface structure protruding away from the peripheral structure 22, the angle formed between the section of the first sub-sidewall in the second sidewall 2120 and the first axis Z1 is greater than or equal to 35° and smaller than or equal to 55°.

In some embodiments, 45°≤α≤55°.

In some embodiments of the present disclosure, as shown in FIG. 16, When the first sidewall 2110 of the first portion 211 and the second sidewall 2120 of the second portion 212 in the light extraction structure 21 are both curved surface structures, a curvature of the second sub-sidewall, protruding away from the peripheral structure 22 of the first sidewall 2110, is smaller than a curvature of the first sub-sidewall, protruding toward the peripheral structure 22, in the second sidewall 2120.

If different positions of the first sidewall 2110 have a same curvature and different positions of the second sidewall 2120 also have a same curvature, then the curvature of the first sidewall 2110 is smaller than that of the second sidewall 2120.

Figure 17:
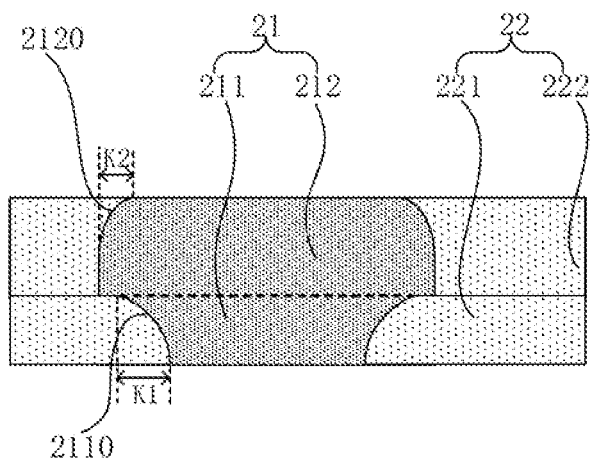
FIG. 17 is a schematic diagram of a light extraction structure in a display panel according to an embodiment of the present disclosure.

FIG. 17 is a schematic diagram of a light extraction structure in a display panel according to an embodiment of the present disclosure.

As shown in FIG. 17, in the same light extraction structure 21, a width K1 of the orthographic projection of the first sidewall 2110 on the substrate 01 is greater than a width K2 of the orthographic projection of the second sidewall 2120 on the substrate 01. In the light extraction structure 21, the first portion 211 closer to the light-emitting element 30 than the second portion 212 will receive more large-angle lights than the second portion 212. By designing a greater width, in the direction parallel to the substrate 01, of the first sidewall 2110 in the first portion 211, more large-angle lights can be captured and converted into small-angle lights. By designing a smaller width, in the direction parallel to the substrate 01, of the second sidewall 2120 in the second portion 212, the area of the second portion 212 will also be smaller, that is, the area of the light extraction structure 21 with a higher refractive index will also be smaller, further reducing reflection of the light extraction structure 21 to the external light.

Figure 18:
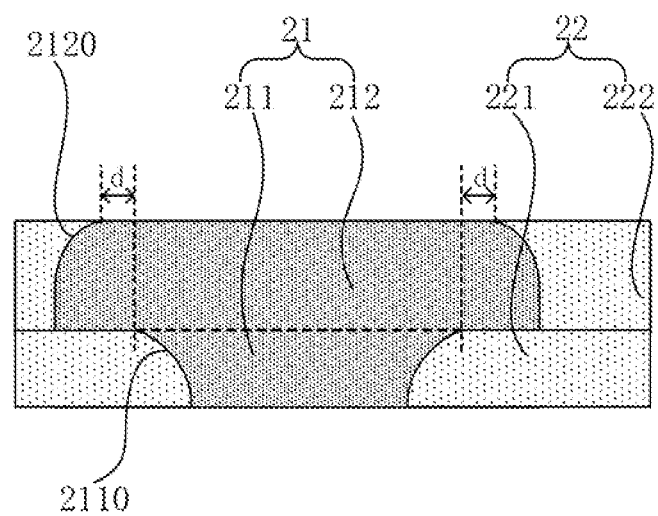
FIG. 18 is a schematic diagram of a light extraction structure in a display panel according to an embodiment of the present disclosure.

FIG. 18 is a schematic diagram of a light extraction structure in a display panel according to an embodiment of the present disclosure.

In some embodiments of the present disclosure, as shown in FIG. 18, in the same light extraction structure 21, the distance between the orthographic projection of the first sidewall 2110 on the substrate 01 and the orthographic projection of the second sidewall 2120 on the substrate 01 is greater than 0. That is, along the direction perpendicular to the substrate 01, the second sidewall 2120 and the first sidewall 2110 do not overlap.

The large-angle lights emitted by the light-emitting element 30 are reflected and refracted at the first sidewall 2110 and then transmitted toward the light-exiting surface of the display panel 001. In these lights, the lights toward the area corresponding to the light-emitting element 30 do not pass through the second sidewall 2120 but exit through the light-emitting surface of the display panel 001 in a small angle. However, in these lights, the lights transmitted away from the area corresponding to the light-emitting element 30 pass through the second sidewall 2120 and are converted into small-angle lights at the second sidewall 2120 through refraction. In the present embodiment, the second sidewall 2120 does not need to capture too many lights and convert them into the small-angle lights. Therefore, the extending length of the second sidewall 2120 can be designed to be smaller, so the width of the light extraction structure 21 can be designed to be smaller, which is conducive to reducing the reflectivity of display panel 001.

In some technical solutions corresponding to this embodiment, as shown in FIG. 18, for at least one light extraction structure 21, in the same light extraction structure 21, the distance between the orthographic projection of the first sidewall 2110 on the substrate 01 and the orthographic projection of the second sidewall 2120 on the substrate 01 is the same at different positions. It can be understood that in at least one light extraction structure 21, the first sidewall 2110 and the second sidewall 2120 in the same light extraction structure 21 are spaced evenly in the direction parallel to substrate 01.

As shown in FIG. 18, the distance between the orthographic projection of the first sidewall 2110 on the substrate 01 and the orthographic projection of the second sidewall 2120 on the substrate 01 is always a fixed distance d, and d>0.

It should be noted that, in any embodiment, the distance between the orthographic projection of the first sidewall 2110 on the substrate 01 and the orthographic projection of the second sidewall 2120 on the substrate 01 refers to a distance between the edge of the orthographic projection of the first sidewall 2110 on the substrate 01 adjacent to the orthographic projection of the second sidewall 2120 on the substrate 01 and the edge of the orthographic projection of the second sidewall 2120 on the substrate 01 adjacent to the orthographic projection of the first sidewall 2110 on the substrate 01.

Figure 19:
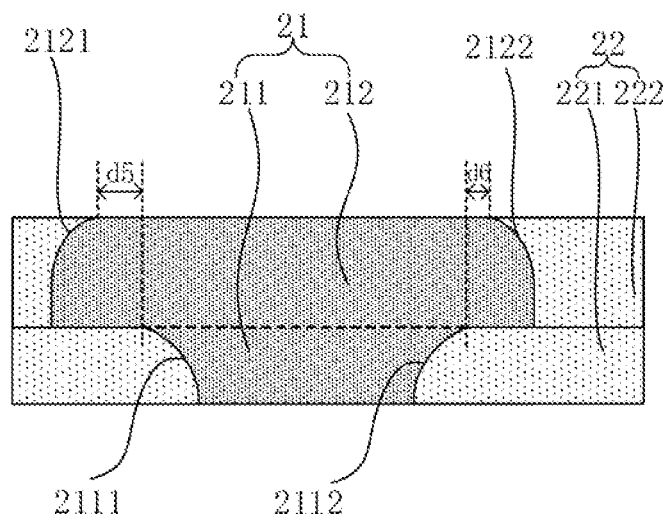
FIG. 19 is a schematic diagram of a light extraction structure in a display panel according to an embodiment of the present disclosure.
Figure 20:
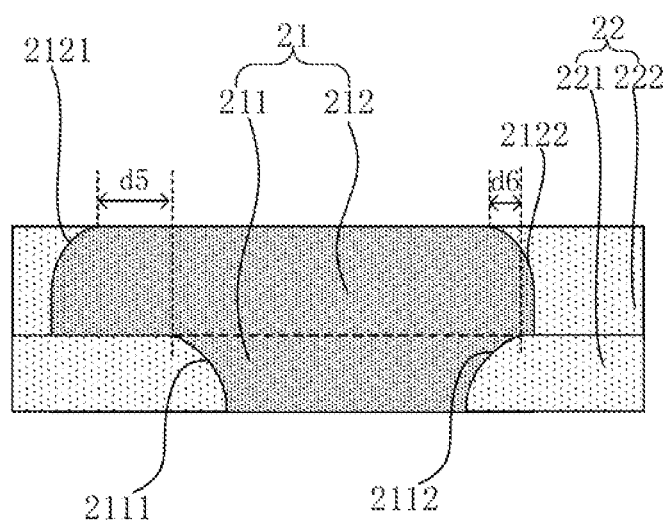
FIG. 20 is a schematic diagram of a light extraction structure in a display panel according to an embodiment of the present disclosure.

FIG. 19 is a schematic diagram of a light extraction structure in a display panel according to an embodiment of the present disclosure, and FIG. 20 is a schematic diagram of a light extraction structure in a display panel according to an embodiment of the present disclosure.

In some embodiments of the present disclosure, as shown in FIG. 19 and FIG. 20, in the same light extraction structure 21, the distance between the orthographic projection of the first sidewall 2110 on the substrate 01 and the orthographic projection of the second sidewall 2120 on the substrate 01 includes a distance d5 and a distance d6, and d5>d6. In other words, in at least one light extraction structure 21, the first sidewall 2110 and the second sidewall 2120 in the same light extraction structure 21 are spaced with different distances in the direction parallel to substrate 01.

With the configuration the second wall 2120 and the first sidewall 2110 are spaced by different distances in at least two directions, the exiting amount of the lights emitted by the light-emitting element 30 are different in the at least two directions.

In some technical solutions corresponding to this embodiment, as shown in FIG. 19, in the same light extraction structure 21, a distance between the orthographic projection of the first sidewall 2110 on the substrate 01 and the orthographic projection of the second sidewall 2120 on the substrate 01 is greater than 0. That is, the first sidewall 2110 and the second sidewall 2120 included in the same light extraction structure 21 do not overlap in the direction perpendicular to substrate 01, so d5>d6>0. As shown in FIG. 19, in the cross section of the light extraction structure 21 passing the center of the light extraction structure 21, the first sidewall 2110 of the first portion 211 includes the first sidewall 2111 and the another first sidewall 2112, and the second sidewall 2120 of the second portion 212 includes the second sidewall 2121 and the another second sidewall 2122. The orthographic projection of the first sidewall 2111 on the substrate 01 and the orthographic projection of the second sidewall 2121 on the substrate 01 do not overlap, and the distance d5 between the orthographic projection of the first sidewall 2111 and the orthographic projection of the second sidewall 2121 is greater than 0. The orthographic projection of the another first sidewall 2112 on the substrate 01 and the orthographic projection of the another second sidewall 2122 on the substrate 01 do not overlap, and the distance d6 between the orthographic projection of the another first sidewall 2112 and the orthographic projection of the another second sidewall 2122 is greater than 0. The spacing between the orthographic projection of the first sidewall 2111 and the orthographic projection of the second sidewall 2121 is greater than the spacing between the orthographic projection of the another first sidewall 2112 and the orthographic projection of the another second sidewall 2122.

In some technical solutions corresponding to this embodiment, as shown in FIG. 20, in the same light extraction structure 21, a distance between a part of the orthographic projection of the first sidewall 2110 on the substrate 01 and the orthographic projection of the second sidewall 2120 on the substrate 01 is greater than 0 and a distance between another part of the orthographic projection of the first sidewall 2110 on the substrate 01 and the orthographic projection of the second sidewall 2120 on the substrate 01 is smaller than 0. That is, in the same light extraction structure 21, a partial area of the first sidewall 2110 and the second sidewall 2120 do not overlap in the direction perpendicular to substrate 01, and another partial area of the first sidewall 2110 and the second sidewall 2120 overlap in the direction perpendicular to substrate 01, so d5>0>d6. As shown in FIG. 20, in the cross section of the light extraction structure 21 passing the center of the light extraction structure 21, the first sidewall 2110 of the first portion 211 includes the first sidewall 2111 and the another first sidewall 2112, and the second sidewall 2120 of the second portion 212 includes the second sidewall 2121 and the another second sidewall 2122. The orthographic projection of the first sidewall 2111 on the substrate 01 and the orthographic projection of the second sidewall 2121 on the substrate 01 do not overlap, and the distance d5 between the orthographic projection of the first sidewall 2111 on the substrate 01 and the orthographic projection of the second sidewall 2121 on the substrate 01 is greater than 0. The orthographic projection of the another first sidewall 2112 on the substrate 01 and the orthographic projection of the another second sidewall 2122 on the substrate 01 overlap. The negative distance d6 between the orthographic projection of the another first sidewall 2112 and the orthographic projection of the another second sidewall 2122 means the orthographic projection of the another first sidewall 2112 and the orthographic projection of the another second sidewall 2122 overlap. The absolute value of the distance d6 between the orthographic projection of the another first sidewall 2112 and the orthographic projection of the another second sidewall 2122 refers to the width of the overlapping region between the orthographic projection of the another first sidewall 2112 and the orthographic projection of the another second sidewall 2122.

Figure 21:
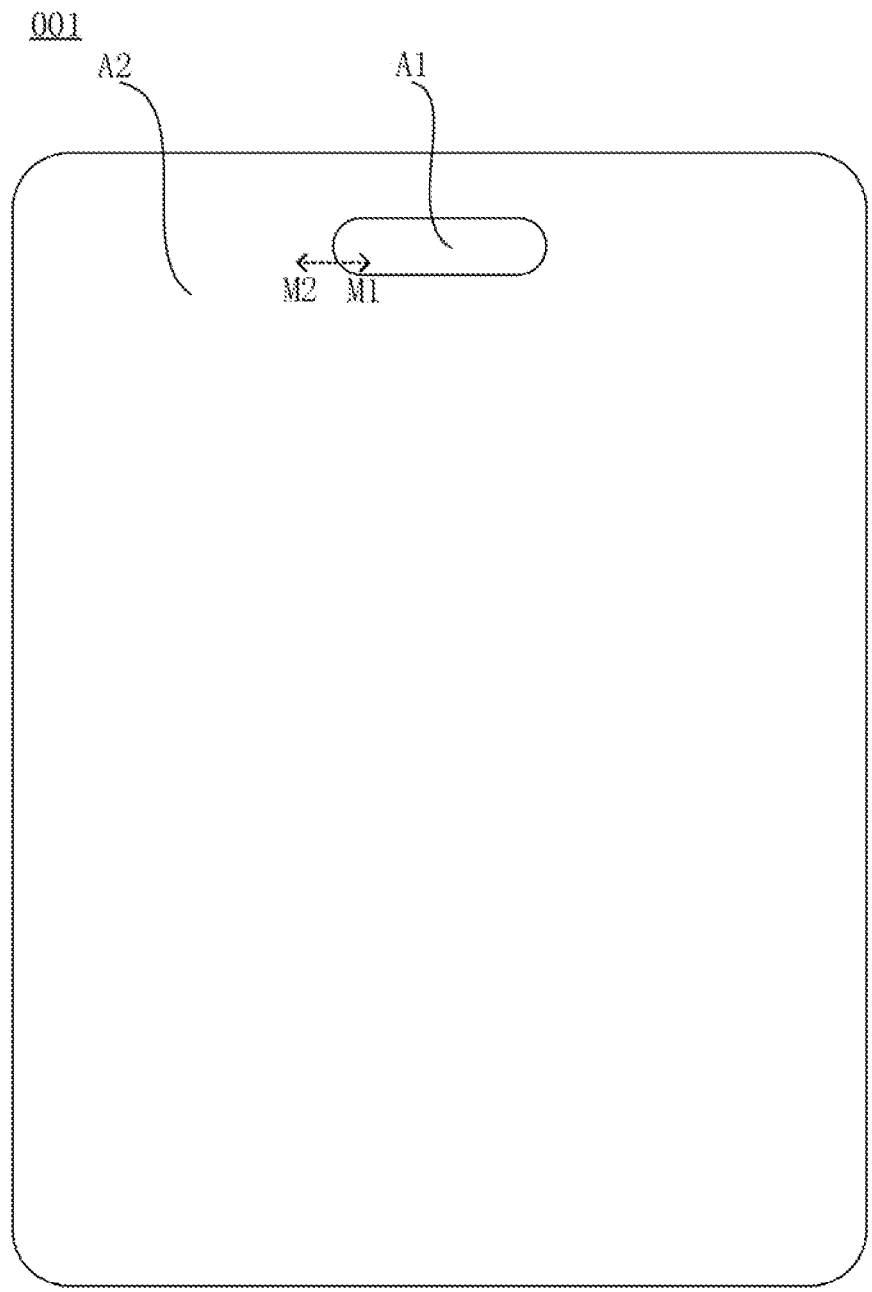
FIG. 21 is a schematic diagram of a display panel according to an embodiment of the present disclosure.

FIG. 21 is a schematic diagram of a display panel according to an embodiment of the present disclosure.

As shown in FIG. 21, the display panel 001 includes a first display area A1 and a second display area A2. The second display area A2 can at least partially surround the first display area A1. The transmittance of the first display area A1 is greater than that of the second display area A2, that is, the transmittance of the first display area A1 to external light is greater than the transmittance of the second display area A2 to external light. External optical elements are provided above or below the first display area A1, such as optical sensors.

In order to achieve high light transmittance of the first display area A1, the density of the light-emitting elements 30 disposed in the first display area A1 can be set smaller than the density of the light-emitting elements 30 disposed in the second display area A2. This results in the difference between the display effect of the first display area A1 and the display effect of the display effect of the second display area A2. Specifically, the reflectivity of the first display area A1 to the external ambient light is greater than the reflectivity of the second display area A2 to the external light, and the brightness of the first display area A1 is smaller than the brightness of the second display area A2. The design of the light extraction structure 21 provided by any embodiment can reduce the difference between the display effect of the first display area A1 and the display effect of the display effect of the second display area A2.

Figure 22:
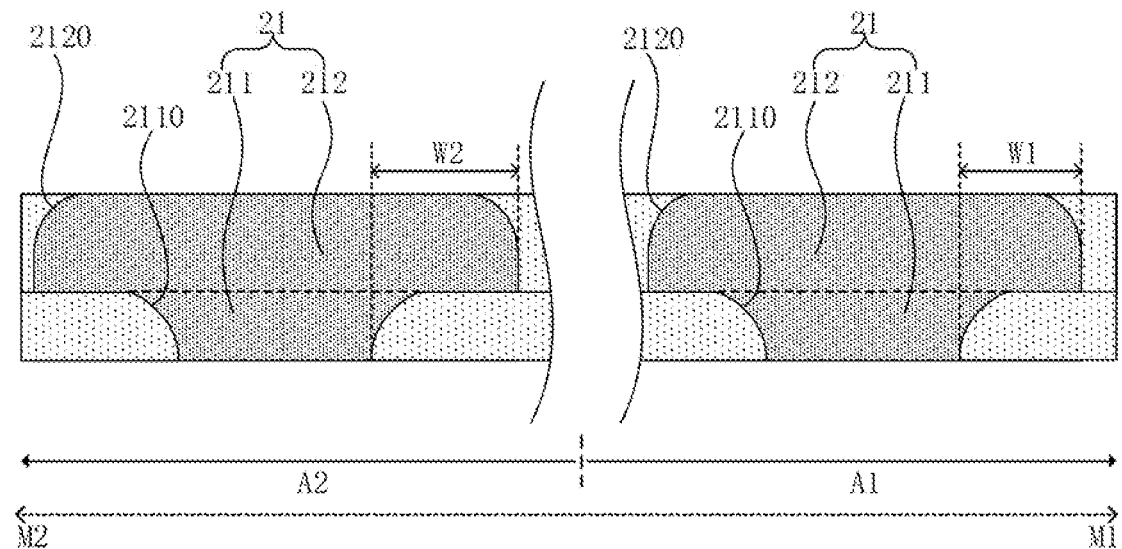
FIG. 22 is a cross-sectional view taken along line M1-M2 shown in FIG. 21 according to an embodiment of the present disclosure.

FIG. 22 is a cross-sectional view taken along line M1-M2 shown in FIG. 21 according to an embodiment of the present disclosure.

In some embodiments, as shown in FIG. 22, in the orthographic projections of the first sidewall 2110 and the second sidewall 2120 included in the light extraction structure 21 disposed in first display area A1 on the substrate 01, a distance between one end of the orthographic projection of the first sidewall 2110 away from the orthographic projection of the second sidewall 2120 and one end of the orthographic projection of the second sidewall 2120 away from the orthographic projection of the first sidewall 2110 is a first distance W1.

In some embodiments, as shown in FIG. 22, in the orthographic projections of the first sidewall 2110 and the second sidewall 2120 included in the light extraction structure 21 disposed in second display area A2 on the substrate 01, a distance between one end of the orthographic projection of the first sidewall 2110 away from the orthographic projection of the second sidewall 2120 and one end of the orthographic projection of the second sidewall 2120 away from the orthographic projection of the first sidewall 2110 is a second distance W2.

The first distance is smaller than or equal to the second distance, i.e., W1≤W2.

In this embodiment, a width of the protrusion of the second portion 212 of the light extraction structure of 21 disposed in the first display area A1 with respect to the first portion 211 is smaller than a width of the protrusion of the second portion 212 of the light extraction structure of 21 disposed in the second display area A2 with respect to the first portion 211. It can be understood that the area of the light extraction structure 21 in the first display area A1 is smaller than the area of the light extraction structure 21 in the second display area A2, thereby reducing the difference between the reflection of the first display area A1 to the external light and the reflection of the second display area A2 to the external light. In addition, the smaller width of the protrusion of the second portion 212 with respect to the first portion 211 can increase the lights that are transmitted through the first sidewall 2110 and incident on the second sidewall 2120, further increasing the light extraction effect of the light extraction structure 21 in the first display area A1 and improving the display brightness of the first display area A1.

Further, the first distance is greater than or equal to 2 μm and smaller than or equal to 3 μm, and the second distance is greater than or equal to 3 μm and smaller than or equal to 4 μm, i.e., 2≤W1 3 μm and 3 μm≤W2≤4 μm.

Figure 23:
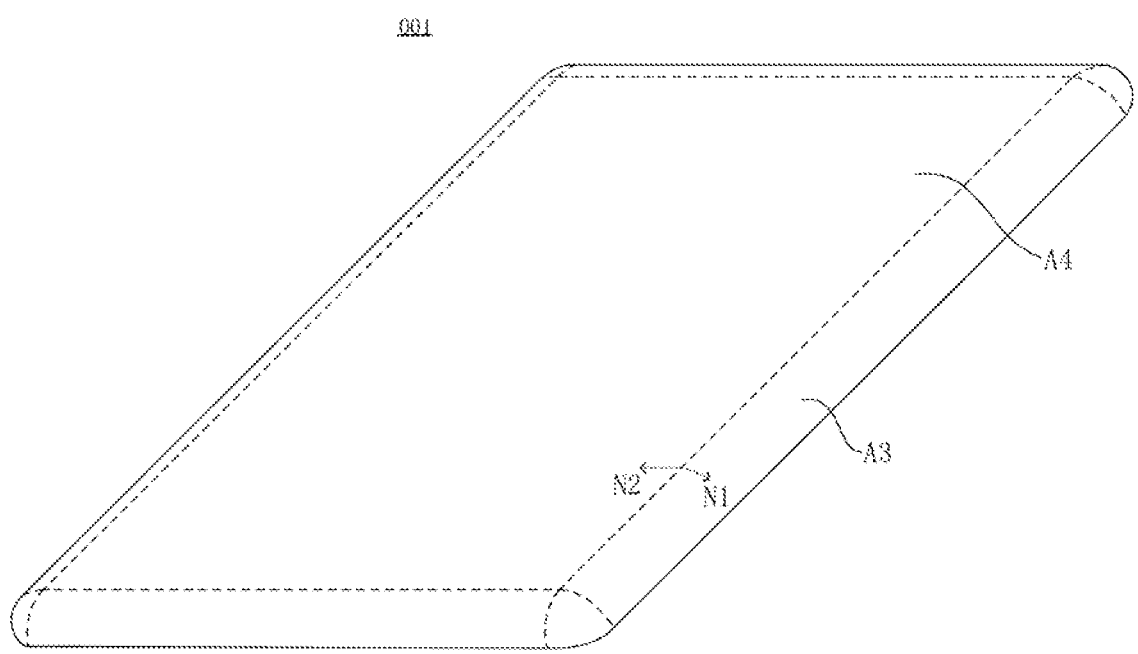
FIG. 23 is a schematic diagram of a display panel according to an embodiment of the present disclosure.

FIG. 23 is a schematic diagram of a display panel according to an embodiment of the present disclosure.

As shown in FIG. 23, the display panel 001 includes a display area A3 and a display area A4, and a curvature of the third display area A3 is greater than a curvature of the fourth display area A4, that is, the display panel 001 can include a curved display area. The third display area A3 can be located at the periphery of the fourth display area A4. By setting the curvature of the third display area A3 greater than the curvature of the fourth display area A4, a non-display area adjacent to the third display area A3 in the display panel 001 can be hided appropriately, and the fourth display area A4 can be a flat display area in the display panel 001.

When the third display area A3 and the fourth display area A4 in the display panel 001 have different curvatures, the angle of the light emitted by the light-emitting element in the third display area A3 and the angle of the light emitted by the light-emitting element in the fourth display area A4 relative to human eyes differ significantly. For example, when human eyes view the fourth display area A4 right ahead of the fourth display area A4, the lights emitted by the light-emitting element 30 in the third display area A3 and transmitted to the human eyes are generally large-angle lights. The large-angle lights attenuate more than small-angle lights during the transmission process, so that when the display panel 001 displays, the brightness attenuation of the third display area A3 is more significantly than that of the fourth display area A4.

Figure 24:
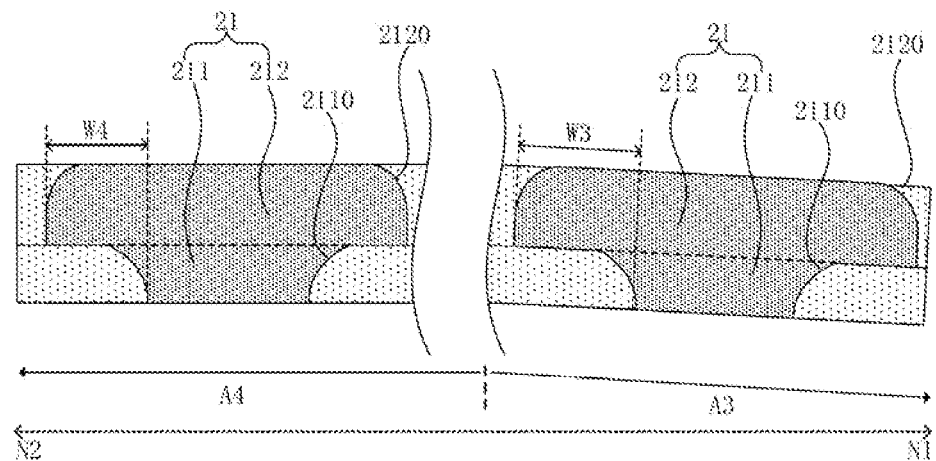
FIG. 24 is a cross-sectional view taken along line N1-N2 shown in FIG. 23 according to an embodiment of the present disclosure.

FIG. 24 is a cross-sectional view taken along line N1-N2 shown in FIG. 23 according to an embodiment of the present disclosure.

As shown in FIG. 24, in the orthographic projections of the first sidewall 2110 and the second sidewall 2120 included in the light extraction structure 21 disposed in the third display area A3 on the substrate 01, a minimum distance between one end of the orthographic projection of the first sidewall 2110 away from the orthographic projection of the second sidewall 2120 and one end of the orthographic projection of the second sidewall 2120 away from the orthographic projection of the first sidewall 2110 is a third distance W3.

In the orthographic projections of the first sidewall 2110 and the second sidewall 2120 included in the light extraction structure 21 disposed in the fourth display area A4 on the substrate 01, a minimum distance between one end of the orthographic projection of the first sidewall 2110 away from the orthographic projection of the second sidewall 2120 and one end of the orthographic projection of the second sidewall 2120 away from the orthographic projection of the first sidewall 2110 is a fourth distance W4.

The third distance W3 is greater than or equal to the fourth distance W4, i.e., W3 W4.

In this embodiment, the second sidewall 2120 of the light extraction structure 21 disposed in the third display area A3 extends by a larger distance with respect to the first sidewall 2110 than the second sidewall 2120 of the light extraction structure 21 disposed in the fourth display area A4, so that the second sidewall 2120 in the third display area A3 can capture a relatively small amount of large-angle lights, that is, the light extraction effect of the light extraction structure 21 in the third display area A3 is less than that of the light extraction structure 21 in the fourth display area A4. Therefore, the display brightness of the third display area A3 is smaller than that of the fourth display area A4, so that the problem of the significant brightness attenuation of the third display area A3 with the increasing angle will be improved.

Figure 25:
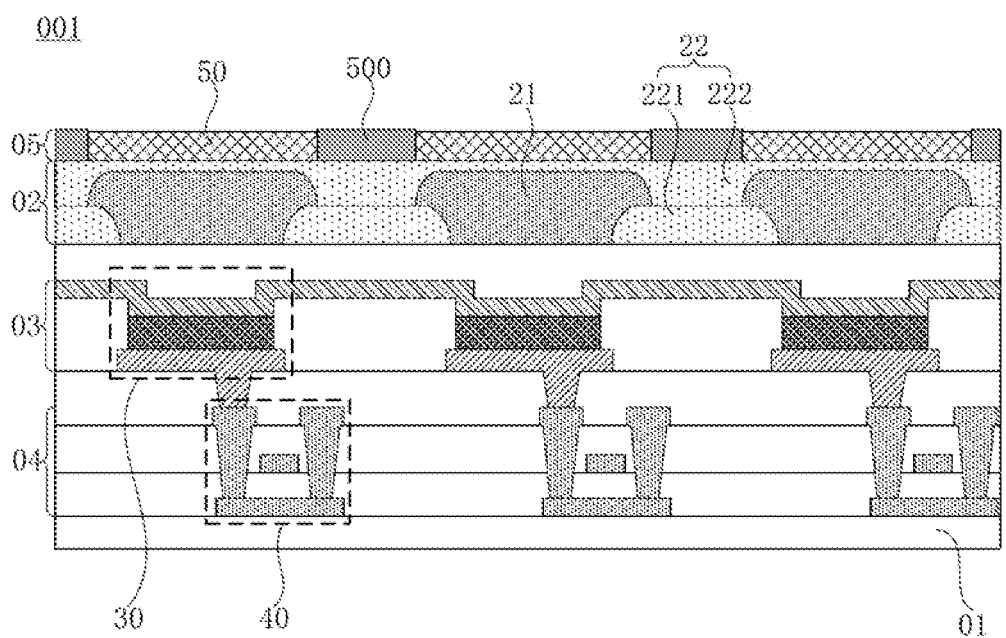
FIG. 25 is a schematic diagram of a display panel according to an embodiment of the present disclosure.
Figure 26:
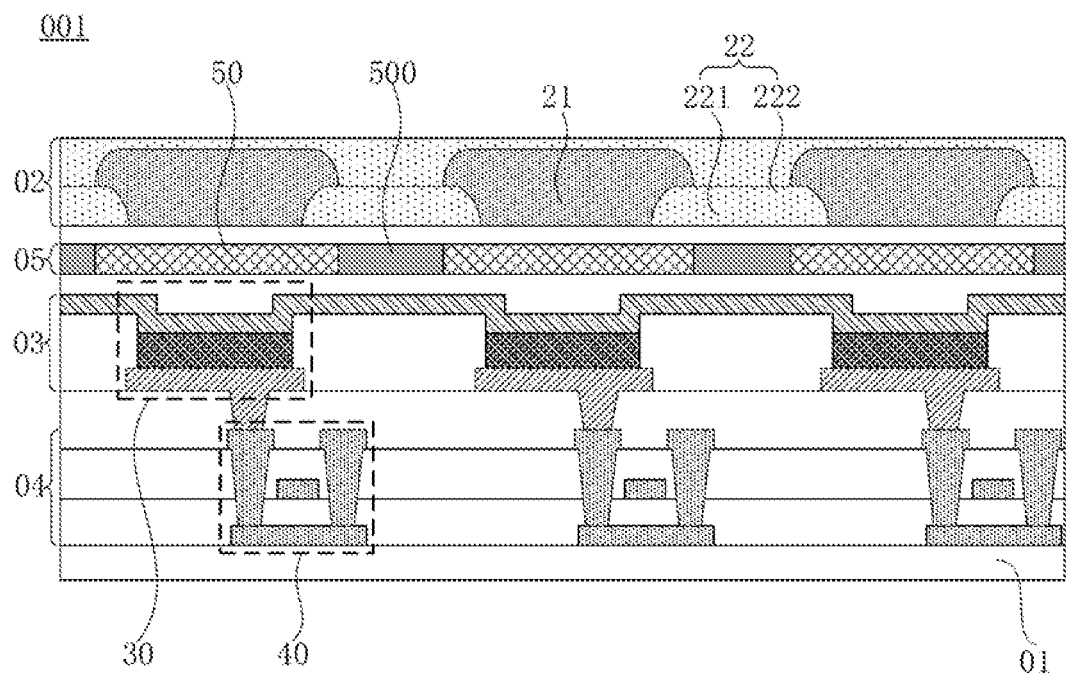
FIG. 26 is a schematic diagram of a display panel according to an embodiment of the present disclosure.

FIG. 25 is a schematic diagram of a display panel according to an embodiment of the present disclosure, and FIG. 26 is a schematic diagram of a display panel according to an embodiment of the present disclosure.

As shown in FIG. 25 and FIG. 26, the display panel 001 further includes a light filtering layer 05, and the light filtering layer 05 includes color filters 50. Along the thickness direction of the display panel 001, the light filtering layer 05 can filter the lights emitted by the light-emitting elements 30 to improve the purity of exiting lights. In addition, the light filtering layer 05 can further filter the external lights incident to the display panel 001, reducing the reflectivity of the display panel 001 to the external light.

The light filtering layer 05 can further include a black matrix 500 located between adjacent color filters 50, avoiding crosstalk of the lights emitted by adjacent light-emitting elements 30.

In some embodiments, as shown in FIG. 25, the light filtering layer 05 is disposed at a side of the light extraction layer 02 away from the substrate 01, and an orthographic projection of each color filter 50 on the substrate 01 covers an orthographic projection of the corresponding light extraction structure 21 on the substrate 01. That is, the color filter 50 is disposed at a side of the light extraction structure 21 toward the light-exiting surface of the display panel 001 and covers the light extraction structure 21.

In some embodiments, as shown in FIG. 26, the light filtering layer 05 is disposed at a side of the light extraction layer 02 adjacent to the substrate 01, that is, the light filtering layer 05 is located between the light extraction layer 02 and the light-emitting element layer 03. In addition, the orthographic projection of the color filter 50 on the substrate 01 can cover the orthographic projection of the corresponding light extraction structure 21 on the substrate 01.

Figure 27:
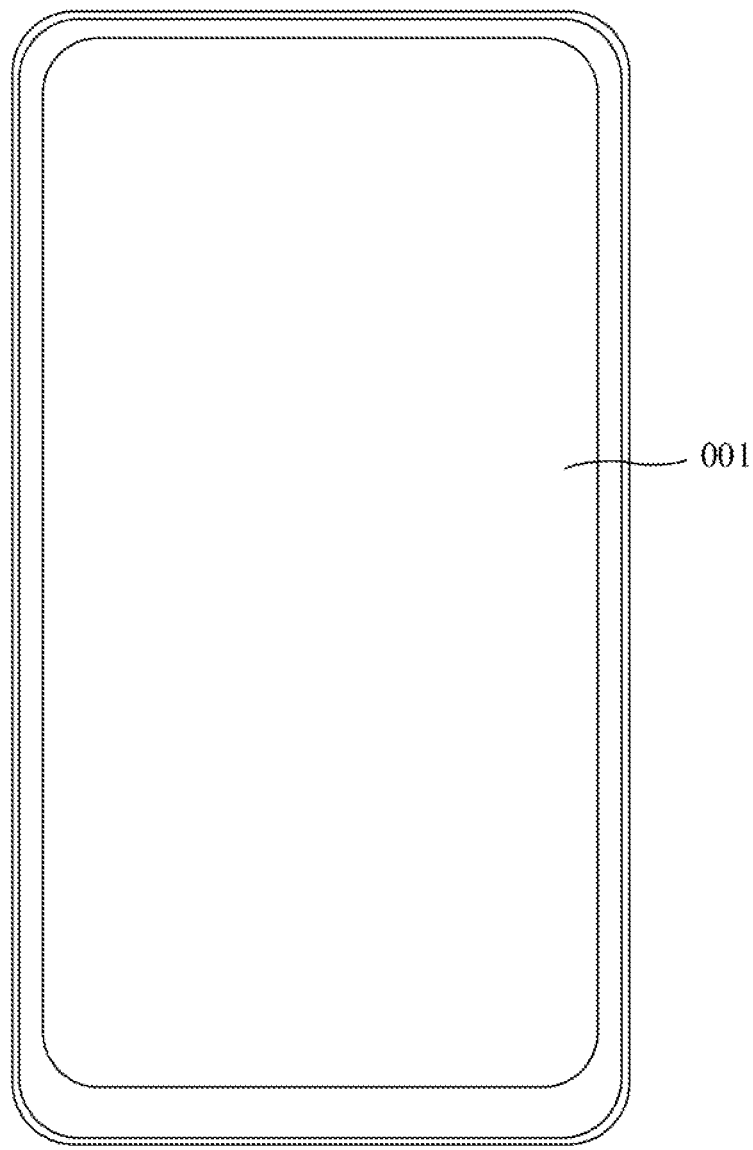
FIG. 27 is a schematic diagram of a display apparatus according to an embodiment of the present disclosure.

FIG. 27 is a schematic diagram of a display apparatus according to an embodiment of the present disclosure.

As shown in FIG. 27, the present disclosure further provides a display apparatus that includes the display panel 001 provided in any one of the above embodiments. For example, the display apparatus can be an electronic element such as a mobile phone, a computer, a smart wearable element (for example, a smart watch) and vehicle-mounted display element, which are not limited by the present disclosure.

In an embodiment of the present disclosure, since the first sidewall 2110 of the first portion 211 of the light extraction structure 21 is inclined away from the first axis Z1, large-angle lights incident to the first sidewall 2110 can become lights with reduced angles. However, these lights that pass through the first sidewall 2110 and have reduced angles still include lights with large angles. These lights with the large angles will be refracted by the second sidewall 2120 of the second portion 212 of the light extraction structure 21 and become lights with further reduced angles. The light extraction structure 21 in the display panel 001 provided in the embodiments of the present disclosure can convert more large-angle lights into small-angle lights, thereby achieving a better light extraction effect and further improving the brightness of display panel 001.

The peripheral structure 22 surrounds the light extraction structure 21, and the adjacent light extraction structures 21 are spaced apart by the peripheral structure 22 and are not connected. That is, the light extraction structure 21 provided by the embodiments of the present disclosure is an isolated island structure. The light extraction structure 21 is arranged in the isolated structure and has a high refractive index, and there is no structure with a high refractive index between adjacent light extraction structures 21, so the overall or total reflection of the high-refractive-index layer to the external lights outside the display panel 001 can be reduced, thereby increasing the resolution and display effect of the display panel 001.

The above are merely some embodiments of the present disclosure, which, as mentioned above, are not used to limit the present disclosure. Whatever within the principles of the present disclosure, including any modification, equivalent substitution, improvement, etc., shall fall into the protection scope of the present disclosure.

What is claimed is:

1. A display panel, comprising:
   a substrate; and
   a light extraction layer disposed at a side of the substrate,
   wherein the light extraction layer comprises light extraction structures and a peripheral structure surrounding the light extraction structures, and the peripheral structure has a refractive index smaller than the light extraction structure;
   wherein each light extraction structure comprises a first portion and a second portion, the second portion is located at a side of the first portion away from the substrate, and an area of an orthographic projection of the second portion on the substrate is greater than an area of an orthographic projection of the first portion on the substrate, and wherein the first portion comprises a first sidewall, the second portion comprises a second sidewall, and the first sidewall and the second sidewall are both inclined; and
   wherein in a direction from one end of the first sidewall adjacent to the substrate and to one end of the first sidewall away from the substrate, the first sidewall extends away from a first axis, and, in a direction from one end of the second sidewall adjacent to the substrate and to one end of the second sidewall away from the substrate, the second sidewall extends toward the first axis, wherein the first axis is perpendicular to the substrate, and passes through a center of an orthographic projection of the light extraction structure on the substrate.

2. The display panel according to claim 1, further comprising a light-emitting element layer located between the light extraction layer and the substrate, wherein the light-emitting element layer comprises light-emitting elements, and an orthographic projection of a light extraction structure of the light extraction structures on the substrate overlaps an orthographic projection of a light-emitting element of the light-emitting elements on the substrate; and
   the area of the orthographic projection of the second portion of the light extraction structure on the substrate is greater than an area of the orthographic projection of the light-emitting element on the substrate.

3. The display panel according to claim 2, wherein an orthographic projection of the second sidewall of the light extraction structure on the substrate does not overlap the orthographic projection of the light-emitting element on the substrate.

4. The display panel according to claim 2, wherein the light extraction structures comprise a first light extraction structure and a second light extraction structure, and the light-emitting elements comprise a first light-emitting element and a second light-emitting element;
   an orthographic projection of the first light extraction structure on the substrate overlaps an orthographic projection of the first light-emitting element on the substrate, and an orthographic projection of the second light extraction structure on the substrate overlaps an orthographic projection of the second light-emitting element on the substrate;
   a distance d1 between an edge of the orthographic projection of the first light extraction structure on the substrate and an edge of the orthographic projection of the first light-emitting element on the substrate is greater than a distance d2 between an edge of the orthographic projection of the second light extraction structure on the substrate and an edge of the orthographic projection of the second light-emitting element on the substrate; and
   along a direction perpendicular to the substrate, a minimum distance h1 between one end of the second sidewall of the first light extraction structure away from the first portion and one end of the first portion away from the second portion is greater than a minimum distance h2 between one end of the second sidewall of the second light extraction structure away from the first portion and one end of the first portion away from the second portion.

5. The display panel according to claim 2, wherein the light extraction structures further comprise a third light extraction structure and a fourth light extraction structure; and
   the light-emitting elements further comprise a third light-emitting element and a fourth light-emitting element,
   wherein an orthographic projection of the third light extraction structure on the substrate overlaps an orthographic projection of the third light-emitting element on the substrate, and an orthographic projection of the fourth light extraction structure on the substrate overlaps an orthographic projection of the fourth light-emitting element on the substrate, and wherein a light-emitting area of the third light-emitting element is greater than a light-emitting area of the fourth light-emitting element;
   a distance between one end of the orthographic projection of the first sidewall of the third light extraction structure away from the orthographic projection of the second sidewall of the third light extraction structure and one end of the orthographic projection of the second sidewall of the third light extraction structure away from the orthographic projection of the first sidewall of the third light extraction structure is d3;
   a distance between one end of the orthographic projection of the first sidewall of the fourth light extraction structure away from the orthographic projection of the second sidewall of the fourth light extraction structure and one end of the orthographic projection of the second sidewall of the fourth light extraction structure away from the orthographic projection of the first sidewall of the fourth light extraction structure is d4, and the distances d3 and d4 satisfy: $d3 \leq d4$.

6. The display panel according to claim 2, wherein the light extraction structures comprise a third light extraction structure and a fourth light extraction structure;
  the light-emitting elements comprise a third light-emitting element and a fourth light-emitting element, wherein an orthographic projection of the third light extraction structure on the substrate overlaps an orthographic projection of the third light-emitting element on the substrate, and an orthographic projection of the fourth light extraction structure on the substrate overlaps an orthographic projection of the fourth light-emitting element on the substrate, and wherein a light-emitting area of the third light-emitting element is greater than a light-emitting area of the fourth light-emitting element; and
  the second sidewall of each of the third light extraction structure and the fourth light extraction structure further comprises:
    a first sub-sidewall having a spatially varying curvature;
    a minimum angle formed between a section of the first sub-sidewall of the second sidewall of the third light extraction structure and the first axis defined as θ1; and
    a minimum angle formed between a section of the first sub-sidewall of the second sidewall of the fourth light extraction structure and the first axis defined as θ2,
    wherein when θ1 is smaller than a preset value, and θ2 is smaller than the preset value, θ1>θ2, and
    wherein when θ1 is greater than the preset value, and θ2 is greater than the preset value, θ1<θ2.

7. The display panel according to claim 1, wherein the light extraction structures comprise a light extraction structure;
  the second portion of the light extraction structure further comprises a third sidewall located at one end of the second sidewall adjacent to the first sidewall; and
  the third sidewall is parallel to the first axis.

8. The display panel according to claim 1, wherein at least one of the first sidewall or the second sidewall is a planar structure.

9. The display panel according to claim 1, wherein at least one the first sidewall or the second sidewall is a curved structure that protrudes away from the peripheral structure.

10. The display panel according to claim 1, wherein the second sidewall is a curved structure and comprises: a first sub-sidewall protruding away from the peripheral structure, wherein the first sub-sidewall has a spatially varying curvature,
  wherein the first sidewall is a curved structure and comprises a second sub-sidewall protruding away from the peripheral structure, wherein the second sub-sidewall has a spatially varying curvature; and
  in one light extraction structure of the light extraction structures, a maximum curvature of the second sub-sidewall of the first sidewall is smaller than a maximum curvature of the first sub-sidewall of the second sidewall.

11. The display panel according to claim 1, wherein the second sidewall comprises a first sub-sidewall having a spatially varying curvature;
  the first sidewall comprises a second sub-sidewall having a spatially varying curvature; and
  in the one light extraction structure of the light extraction structures, a minimum angle between the second sub-sidewall of the first sidewall and the first axis is smaller than a minimum angle between the first sub-sidewall of the second sidewall and the first axis.

12. The display panel according to claim 11, wherein an angle between the second sub-sidewall of the first sidewall and the first axis is greater than or equal to 15° and smaller than or equal to 45°.

13. The display panel according to claim 11, wherein an angle formed between the first sub-sidewall of the second sidewall and the first axis is greater than or equal to 35° and smaller than or equal to 55°.

14. The display panel according to claim 1, wherein in one light extraction structure of the light extraction structures, a width of the orthographic projection of the first sidewall on the substrate is greater than a width of the orthographic projection of the second sidewall on the substrate.

15. The display panel according to claim 1, wherein in one light extraction structure of the light extraction structures, a distance between the orthographic projection of the first sidewall on the substrate and the orthographic projection of the second sidewall on the substrate is greater than 0.

16. The display panel according to claim 1, wherein for at least one light extraction structure of the light extraction structures, a distance between the orthographic projection of the first sidewall on the substrate and the orthographic projection of the second sidewall on the substrate in a same light extraction structure of the at least one light extraction structure comprises distances d5 and d6,
  wherein d5 is a distance between the orthographic projection of the first sidewall and the orthographic projection of the second sidewall, and wherein d6 is a distance between the orthographic projection of another first sidewall and the orthographic projection of another second sidewall, and further wherein d5>d6.

17. The display panel according to claim 16, wherein d5>d6>0, or d5>0>d6.

18. The display panel according to claim 1, further comprising:
  a first display area;
  a second display area; and a light transmittance of the first display area is greater than a light transmittance of the second display area,
  wherein the light extraction structures comprise a first-type light extraction structure located in the first display area and a second-type light extraction structure located in the second display area,
  wherein a minimum distance between one end of the orthographic projection of the first sidewall of the first-type light extraction structure away from the orthographic projection of the second sidewall and one end of the orthographic projection of the second sidewall of the first-type light extraction structure away from the orthographic projection of the first sidewall is a first distance;
  wherein a minimum distance between one end of the orthographic projection of the first sidewall of the second-type light extraction structure away from the orthographic projection of the second sidewall and one end of the orthographic projection of the second sidewall of the second-type light extraction structure away from the orthographic projection of the first sidewall is a second distance; and
  wherein the first distance is smaller than or equal to the second distance.

19. The display panel according to claim 1, further comprising:
  a third display area;
  and a fourth display area, wherein a curvature of the third display area is greater than a curvature of the fourth display area, wherein the light extraction structures comprise a third-type light extraction structure located in the third display area and a fourth-type light extraction structure located in the fourth display area;

wherein a minimum distance between one end of the orthographic projection of the first sidewall of the third-type light extraction structure away from the orthographic projection of the second sidewall and one end of the orthographic projection of the second sidewall of the third-type light extraction structure away from the orthographic projection of the first sidewall is a third distance;

wherein a minimum distance between one end of the orthographic projection of the first sidewall of the fourth-type light extraction structure away from the orthographic projection of the second sidewall and one end of the orthographic projection of the second sidewall of the fourth-type light extraction structure away from the orthographic projection of the first sidewall is a fourth distance; and wherein the third distance is smaller than or equal to the fourth distance.

20. A display apparatus, comprising:

a display panel, wherein the display panel comprises:

a substrate; and a light extraction layer disposed at a side of the substrate, wherein the light extraction layer comprises light extraction structures and a peripheral structure surrounding the light extraction structures, and the peripheral structure has a refractive index smaller than the light extraction structure;

wherein each light extraction structure comprises a first portion and a second portion, the second portion is located at a side of the first portion away from the substrate, and an area of an orthographic projection of the second portion on the substrate is greater than an area of an orthographic projection of the first portion on the substrate, and wherein the first portion comprises a first sidewall, the second portion comprises a second sidewall, and the first sidewall and the second sidewall are both inclined; and wherein in a direction from one end of the first sidewall adjacent to the substrate to one end of the first sidewall away from the substrate, the first sidewall extends away from a first axis; and in a direction from one end of the second sidewall adjacent to the substrate to one end of the second sidewall away from the substrate, the second sidewall extends toward the first axis, wherein the first axis is perpendicular to the substrate, and passes through a center of an orthographic projection of the light extraction structure on the substrate.

* * * * *